United States Patent
Azadet et al.

(10) Patent No.: US 12,068,904 B2
(45) Date of Patent: Aug. 20, 2024

(54) METHOD AND APPARATUS FOR IN-PHASE AND QUADRATURE IMBALANCE CORRECTION IN A FREQUENCY DOMAIN

(71) Applicant: Intel Corporation, Santa Clara, CA (US)

(72) Inventors: Kameran Azadet, San Ramon, CA (US); Marc Jan Georges Tiebout, Finkenstein (AT)

(73) Assignee: Intel Corporation, Santa Clara, CA (US)

( * ) Notice: Subject to any disclaimer, the term of this patent is extended or adjusted under 35 U.S.C. 154(b) by 726 days.

(21) Appl. No.: 17/131,823

(22) Filed: Dec. 23, 2020

(65) Prior Publication Data
US 2022/0200838 A1  Jun. 23, 2022

(51) Int. Cl.
H04L 27/38 (2006.01)
H03D 3/00 (2006.01)
H04B 1/04 (2006.01)
H04L 27/36 (2006.01)

(52) U.S. Cl.
CPC ......... H04L 27/3863 (2013.01); H03D 3/009 (2013.01); H04B 1/0475 (2013.01); H04L 27/364 (2013.01)

(58) Field of Classification Search
CPC ... H04L 27/364; H04L 27/3863; H03D 3/009; H04B 1/0475
See application file for complete search history.

(56) References Cited

U.S. PATENT DOCUMENTS

| 9,612,794 B2 | 4/2017 | Azadet et al. | |
|---|---|---|---|
| 2008/0037410 A1* | 2/2008 | Egashira | H04L 27/2647 370/206 |
| 2008/0279221 A1* | 11/2008 | Wen | H04L 27/3863 370/500 |
| 2011/0135036 A1* | 6/2011 | Andgart | H04L 27/2647 375/316 |
| 2013/0216004 A1 | 8/2013 | Hsu et al. | |
| 2013/0259153 A1 | 10/2013 | Varanese et al. | |
| 2013/0259173 A1* | 10/2013 | Varanese | H04L 27/3854 375/346 |
| 2020/0091608 A1* | 3/2020 | Alpman | H01Q 21/24 |

OTHER PUBLICATIONS

Yuuichi Aoki et al.: "1.4-GHz Bandwidth Frequency-Dependent I/Q Imbalance Calibration for 5G mmWave Communications", 2019 IEEE/MTT-S International Microwave Symposium, pp. 626-629.

* cited by examiner

*Primary Examiner* — Siu M Lee
(74) *Attorney, Agent, or Firm* — 2SPL Patent Attorneys PartG mbB; Yong Beom Hwang

(57) ABSTRACT

An apparatus and method for in-phase/quadrature (I/Q) imbalance correction in a transceiver. The apparatus includes an I/Q imbalance correction circuit and a correction coefficient generation circuit. The I/Q imbalance correction circuit is configured to modify I/Q data in a frequency domain using correction coefficients to generate corrected I/Q data. The correction coefficient generation circuit is configured to generate the correction coefficients for the I/Q imbalance correction circuit based on the I/Q data and reference data.

10 Claims, 26 Drawing Sheets

EVM: 6.6%

EVM: 1.9%

Out of band components are filtered out

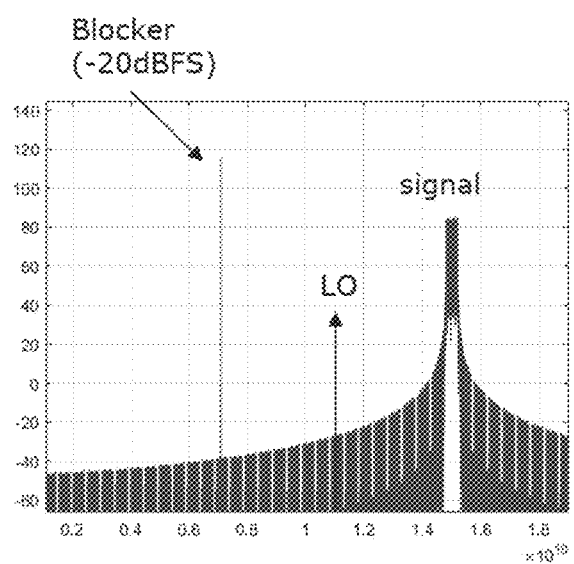
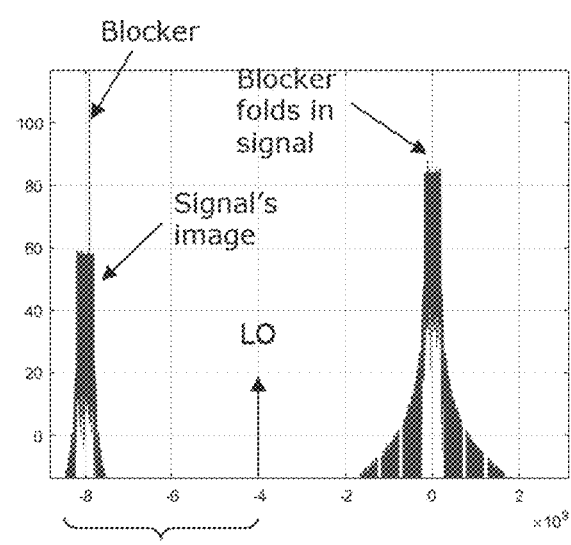
Out of band components are filtered out
FIG. 20A                    FIG. 20B

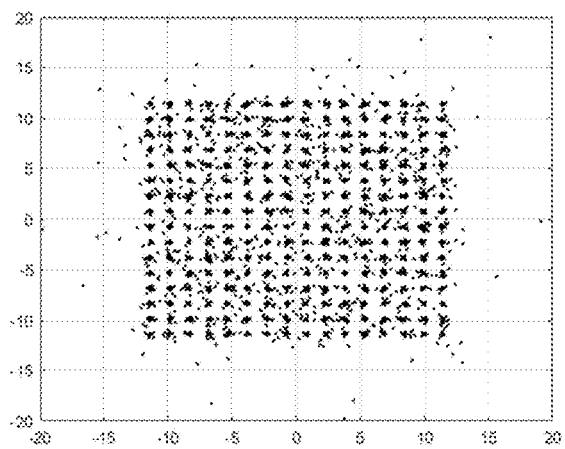
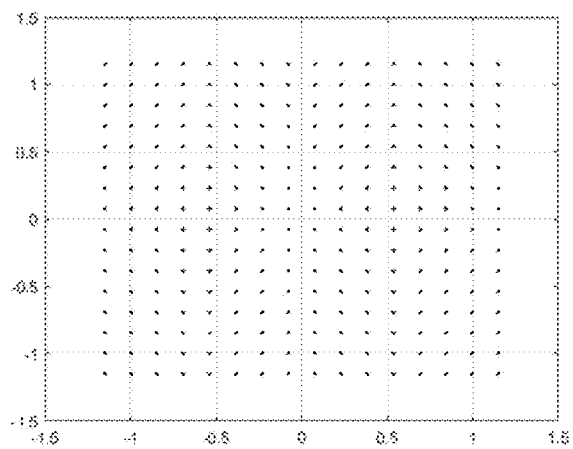
EVM=0.26%
after correction
FIG. 23A                    FIG. 23B

METHOD AND APPARATUS FOR IN-PHASE AND QUADRATURE IMBALANCE CORRECTION IN A FREQUENCY DOMAIN

FIELD

Examples relate to in-phase/quadrature (I/Q) imbalance correction in a transceiver, more particularly a method and apparatus for I/Q imbalance correction in a frequency domain.

BACKGROUND

Evolution of Fifth Generation (5G) wireless communication system will require very significant increase in signal bandwidth and higher center frequencies. This implies use of mixers with very wide-bandwidth signals. An I/Q imbalance is frequency selective, and complexity increases quadratically with the signal bandwidth.

BRIEF DESCRIPTION OF THE FIGURES

Some examples of apparatuses and/or methods will be described in the following by way of example only, and with reference to the accompanying figures, in which

FIGS. 20A and 20B show a signal of interest, an LO signal, and a blocker at the image frequency of the signal of interest;

FIGS. 23A and 23B show simulation results of error vector magnitudes before and after IQ imbalance correction;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
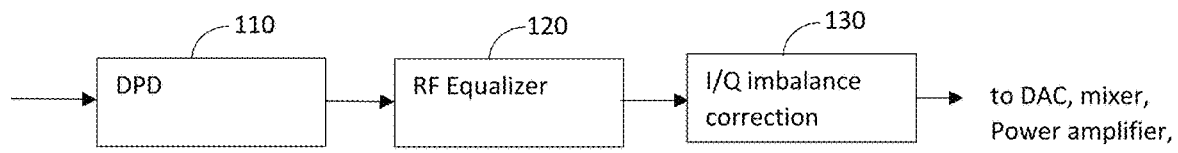
FIG. 1 shows a portion of an exemplary transmitter in which aspects of the examples disclosed hereinafter may be employed.

FIG. 1 shows a portion of an exemplary transmitter 100 in which aspects of the examples disclosed hereinafter may be employed. The transmitter 100 may include a digital pre-distortion (DPD) circuit 110, a radio frequency (RF) equalizer circuit 120, and an I/Q imbalance correction circuit 130. The output from the I/Q imbalance correction circuit 130 may be further processed by a digital-to-analog converter (DAC), a mixer for up-conversion, a power amplifier, and the like for transmission. In some examples, the RF equalizer circuit 120 and the I/Q imbalance correction circuit 130 may be combined into a single unit.

The DPD circuit 110 modifies transmit data to linearize the power amplifier to improve efficiency. The DPD circuit 110 pre-distorts the transmit data to compensate for the non-linear effects caused by the power amplifier. The DPD circuit 110 is an optional component that can be omitted.

The RF equalizer circuit 120 implements RF channel equalization to mitigate channel impairments. The RF equalizer circuit 120 may be implemented, for example, as a finite impulse response (FIR) filter. Generally, an RF equalizer circuit 120 compensates for dispersion in the RF path (e.g., in printed circuit board (PCB) board traces, RF cables, etc.) and/or for the frequency dependent linear response of a power amplifier and other RF circuits in the transmit and receive chains. When a channel has been properly equalized, the frequency domain attributes of the signal at the input are reproduced at the output.

The I/Q imbalance correction circuit 130 corrects for amplitude and phase mismatch in an I/Q signal pair to avoid unwanted spectral components at the negative signal frequency. In a quadrature amplitude modulation (QAM) modulation, the I/Q components of a signal identify a symbol being communicated. The I/Q ratio is modulated by controlling the amplitudes of two sinusoids separated in phase by 90 degrees. An I/Q imbalance is introduced when the two generated sinusoids are not perfectly matched in amplitude and orthogonal in phase, causing a received constellation point to be mis-aligned with a constellation point corresponding to the desired symbol. When the quadrature mixer pair in up/down mixers do not have an exactly equal gain, it causes a gain imbalance. When the local oscillator signals of I/Q mixer pair do not differ by exactly 90 degrees, it causes a phase imbalance.

Time domain I/Q imbalance correction may work for lower bandwidth signals. However, when the signal bandwidth increases to 100s of MHz to above gigahertz, the cost and power consumption of the time domain I/Q imbalance correction can be an issue.

The transceiver system may not work well without I/Q imbalance correction. The complexity of I/Q imbalance correction circuit in time domain is prohibitive. In 5G evolution and 6G radio signal processing can be done in frequency domain in the radio (for example using vector processors). Performing the I/Q imbalance correction operation in frequency domain could offer a very low-cost solution.

Examples are disclosed for a method and an apparatus for I/Q imbalance correction in a frequency domain. If the mismatch between the DACs or ADCs in I/Q branches and mixer I and Q terminals have a limited impulse response that is less than the cyclic prefix of an orthogonal frequency division multiplex (OFDM) signal, the I/Q imbalance correction may be performed in a frequency domain.

Figure 2:
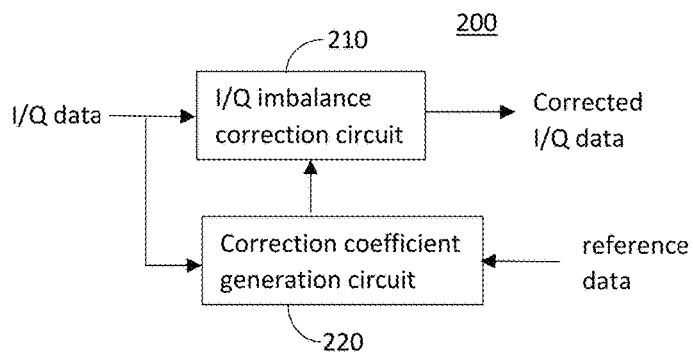
FIG. 2 is a block diagram of an example apparatus for I/Q imbalance correction in a frequency domain in accordance with one example.

FIG. 2 is a block diagram of an example apparatus 200 for I/Q imbalance correction in a frequency domain in accordance with one example. The apparatus 200 may be included in a base station or other network apparatus in a wireless communication system, such as Forth Generation (4G), Fifth Generation (5G), etc. The apparatus 200 may be included in a user equipment such as a mobile phone, a tablet, a handset, or the like. The apparatus 200 includes an I/Q imbalance correction circuit 210 and a correction coefficient generation circuit 220.

The I/Q imbalance correction circuit 210 is configured to modify the input I/Q data in a frequency domain using correction coefficients and generate corrected I/Q data. The correction coefficient generation circuit 220 is configured to generate the correction coefficients for the I/Q imbalance correction circuit 210 based on the input I/Q data and reference data. The I/Q data may be transmit data or receive data. For calibration (I/Q imbalance correction) of a transmit path, the reference signal is obtained via an observation receiver (not shown in FIG. 2). The transmit signal is coupled onto the observation path as a feedback signal and the observation receiver down-converts and demodulates the feedback signal to generate the reference data. For calibration (I/Q imbalance correction) of a receive path, the reference signal may be a pre-configured data carried in the received signal, such as a pilot signal, reference symbols, a training sequence, or the like, or a signal transmitted via the transmit path and obtained via the observation receiver as in the calibration for the transmit path.

The I/Q imbalance correction circuit 210 is configured to generate the corrected I/Q data in a frequency domain based on the I/Q data and a complex conjugate of the I/Q data at a mirror image frequency in a frequency domain. For example, the I/Q imbalance correction circuit 210 is configured to generate the corrected I/Q data in a frequency domain as follows:

$$Y(f)=A(f)X(f)+B(f)X^*(-f),$$

wherein $Y(f)$ is the corrected I/Q data in a frequency domain, $X(f)$ is the I/Q data before I/Q imbalance correction in a frequency domain, $X^*(-f)$ is a complex conjugate of the I/Q data at a mirror image frequency before I/Q imbalance correction in a frequency domain, $A(f)$ and $B(f)$ are the correction coefficients in a frequency domain.

Figure 3:
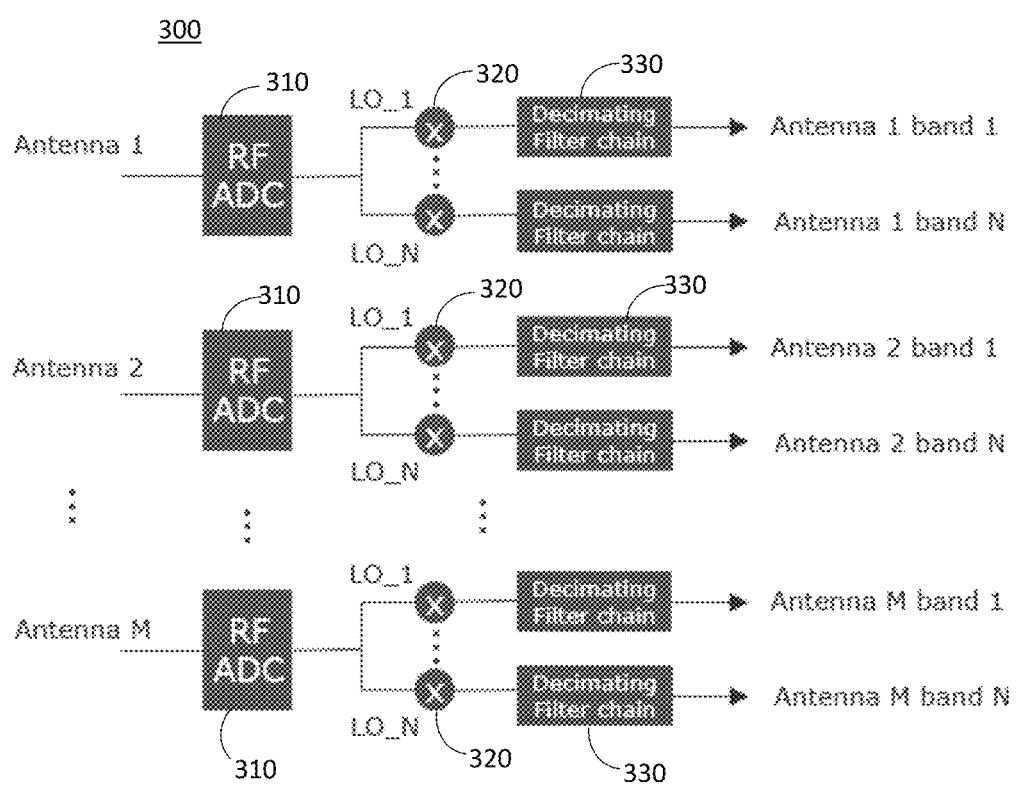
FIG. 3 is a schematic diagram of an example apparatus in which aspects of the examples disclosed herein may be employed.

FIG. 3 is a schematic diagram of an example apparatus 300 in which aspects of the examples disclosed herein may be employed. The apparatus 300 may be included in a base station or a user equipment. The apparatus 300 may include a plurality of RF ADCs 310 for digitizing signals received from a plurality of antennas (antenna 1, . . . , antenna M). The received signals are wideband signals that may include a plurality of frequency bands (band 1, . . . , band N). Each RF ADC 310 samples an RF signal received from an antenna to which each RF ADC 310 is coupled. The digitized data output from each RF ADC 310 may be then down-converted by a plurality of digital mixers 320 and filtered by decimating filters 330 for the frequency bands (band 1, . . . , band N). It should be noted that FIG. 3 shows only receive chains for simplicity, but the apparatus 300 may also include transmit chains with similar structure.

Figure 4:
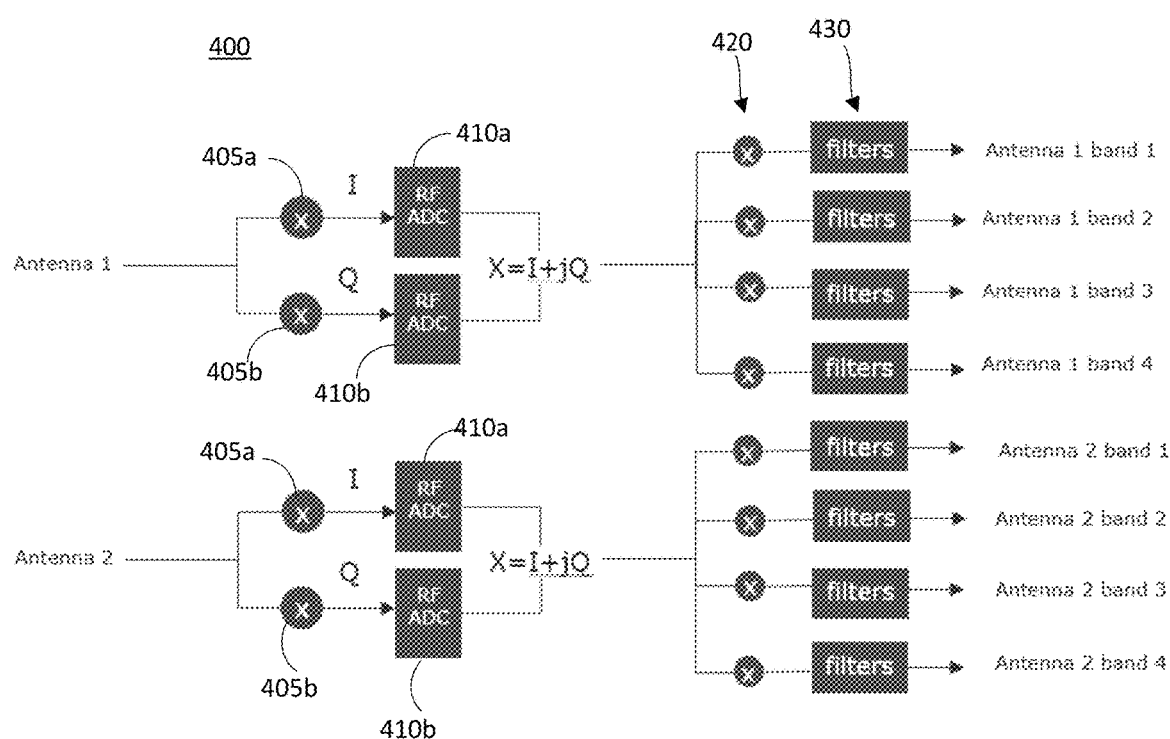
FIG. 4 shows a specific example of an apparatus in accordance with one example in which aspects of the examples disclosed herein may be employed.

FIG. 4 shows a specific example of an apparatus 400 in accordance with one example in which aspects of the examples disclosed herein may be employed. FIG. 4 shows only four RF ADCs 410 for processing signals including four frequency bands received via two antennas. However, it should be noted that the apparatus 400 shown in FIG. 4 is merely an example, not a limitation, and the apparatus 400 may include more than four ADCs for processing more or less than four frequency bands received via two or more antennas.

An RF signal received from each antenna may be down-converted by a pair of mixers 405a/405b (I/Q mixers) to I/Q signals and the I/Q signals may then be digitized by a pair of RF ADCs 410a/410b, respectively. The I/Q data from the pair of RF ADCs 410a/410b may be then down-converted by digital mixers 420 and then filtered by filters 430 for specific frequency bands (4 frequency bands in this example), respectively. It should be noted that FIG. 4 shows only receive chains for simplicity, but the apparatus 400 may also include transmit chains with similar structure.

Figure 5:
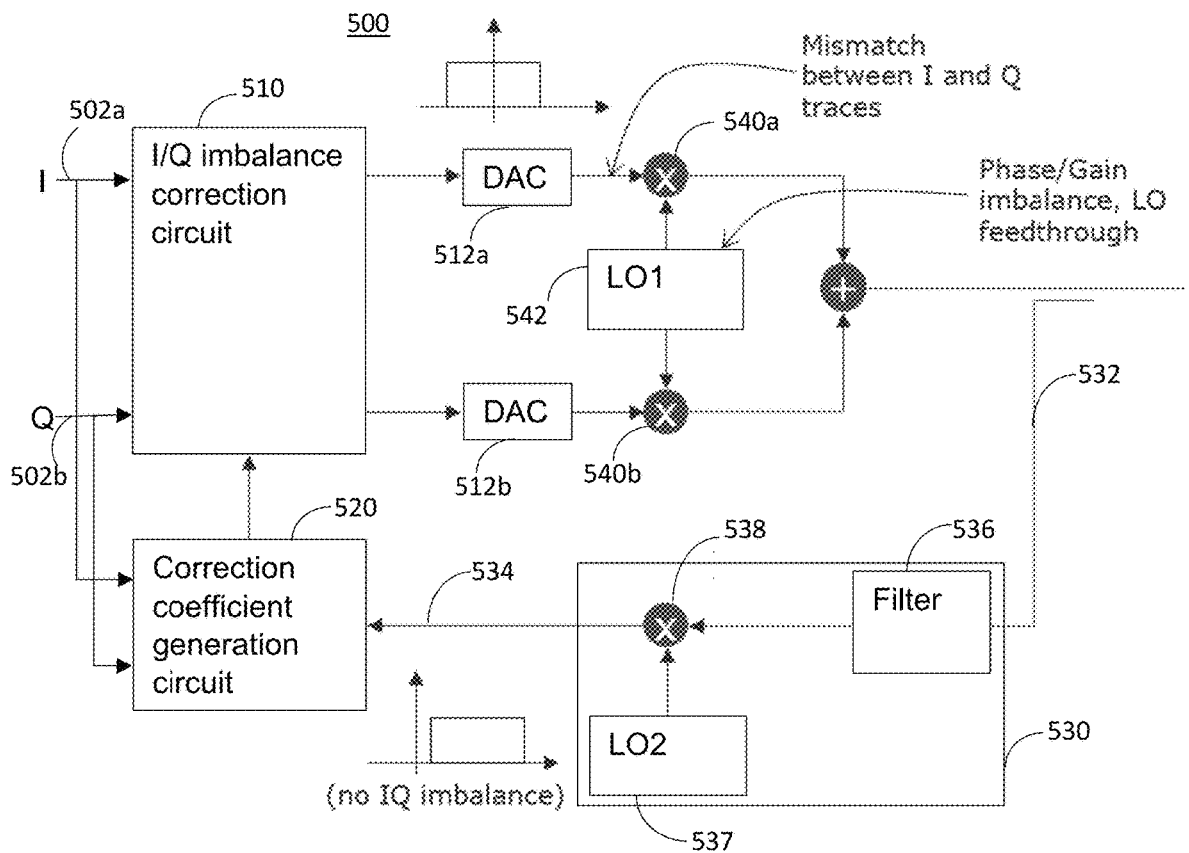
FIG. 5 is a block diagram of an example transmitter configured for I/Q imbalance correction in a frequency domain in accordance with one example.

FIG. 5 is a block diagram of an example transmitter 500 configured for I/Q imbalance correction in a frequency domain in accordance with one example. The transmitter 500 includes an I/Q imbalance correction circuit 510, a correction coefficient generation circuit 520, and an observation receiver 530. The I/Q imbalance correction circuit 510 and the correction coefficient generation circuit 520 are configured to implement I/Q imbalance correction in a frequency domain.

The I/Q imbalance correction circuit 510 receives I/Q data 502a/502b for transmission and modifies the I/Q data 502a/502b in a frequency domain using correction coefficients to correct the I/Q imbalance. The I/Q imbalance correction circuit 510 modifies the input I/Q data 502a/502b in a frequency domain as in Equation (15) described below. The correction coefficients used in the I/Q imbalance correction circuit 510 are updated by the correction coefficient generation circuit 520.

The correction coefficient generation circuit 520 generates the correction coefficients for the I/Q imbalance correction circuit 510 based on the I/Q data 502a/502b and reference data 534. The reference data is obtained from an observation receiver 530. The correction coefficient generation circuit 520 may implement any adaptation algorithm (e.g., least mean square (LMS) algorithm) for determination of the correction coefficients.

The I/Q data modified by the I/Q imbalance correction circuit 510 may be converted to an analog signal by a digital-to-analog converter (DAC) 512a/512b and up-converted by the mixers 540a/540b with a local oscillator signal from LO1 542, respectively. Alternatively, an RF DAC may be used for digital up-conversion and digital-to-analog conversion. The up-converted I/Q signals are then combined and sent for further processing, such as filtering, amplification, etc., and then sent for transmission to an antenna panel, a monolithic microwave integrated circuit (MMIC), or a radio frequency integrated circuit (RFIC).

Figure 6:
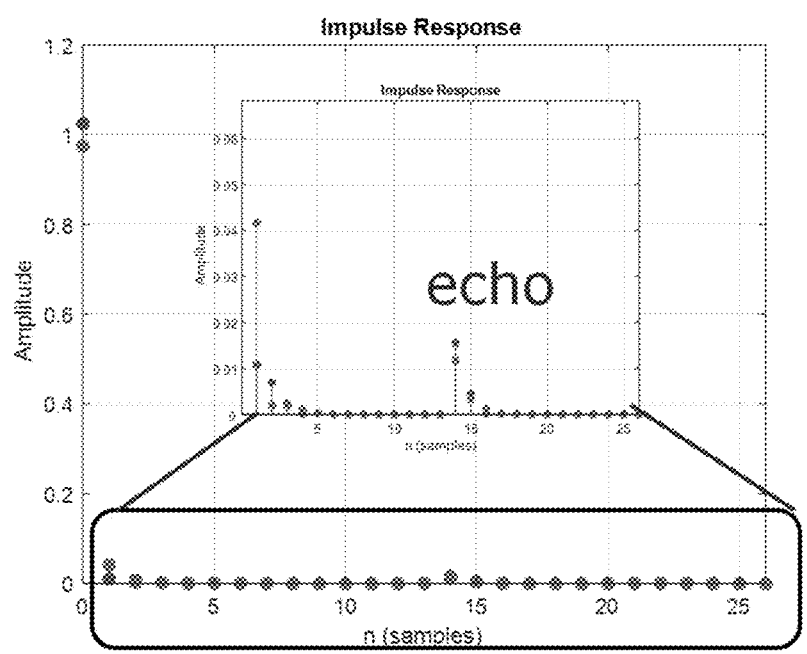
FIG. 6 shows an example of mismatch of I/Q traces.

The I/Q imbalance may be caused by numerous reasons. For example, there may be a mismatch between the I and Q traces (e.g., PCB board traces, RF cables, etc.). FIG. 6 shows an example of mismatch of I/Q traces, e.g., the mismatch of the impulse responses on the I/Q channel. The local oscillator (LO) signals may have phase or gain imbalance between the I and Q channels. The LO signals may also appear on the transmit path through the mixers 540a/540b (LO feedthrough).

The transmit signal may be coupled onto the observation path 532 as a feedback signal. The observation receiver 530 processes the feedback signal and provides the reference data 534 to the correction coefficient generation circuit 520. The observation receiver 530 may be a main receiver of the apparatus 500 (e.g., one of a plurality of main receivers) or a separate receiver dedicated for the I/Q imbalance correction purposes. In some examples, the observation path 532 may be I/Q calibrated in advance, for example using pilot signals or reference symbols sent from a remote end (e.g., in case where a main receiver is used for the calibration).

The observation receiver 530 may include a filter 536 for filtering the feedback signal and a mixer 538 for down-converting the feedback signal with a local oscillator signal from the LO2 537. In one example, the frequency of the LO2 537 may be different from the frequency of the LO1 542, i.e., the feedback signal is down-converted to a non-zero intermediate frequency and then processed to generate the reference data 534. As long as there is signal energy and the image frequency (relative to LO2), there is no corruption of the demodulated TX observation signal. The filter 536 is used to remove any energy at the image frequencies. The correction coefficient generation circuit 520 may adaptively generate the correction coefficients for the I/Q imbalance correction circuit 510 based on the reference data 534 and the I/Q data 502a/502b such that the I/Q imbalance correction circuit 510 corrects for amplitude and phase mismatch in an I/Q signal pair.

Figure 7:
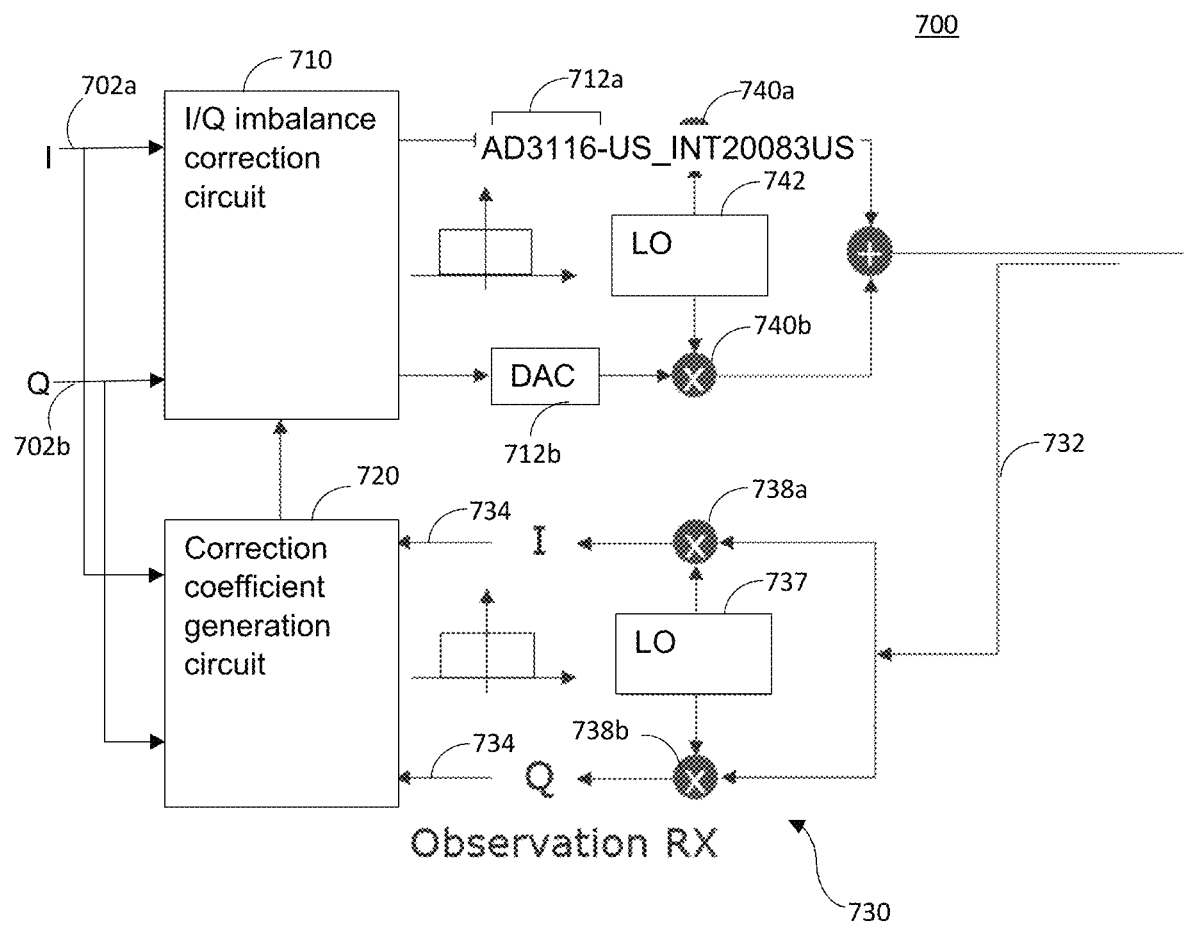
FIG. 7 is a schematic block diagram of an example transmitter configured for I/Q imbalance correction in a frequency domain in accordance with another example.

FIG. 7 is a schematic block diagram of an example transmitter 700 configured for I/Q imbalance correction either in a frequency domain or in a time domain in accordance with another example. The transmitter 700 includes an I/Q imbalance correction circuit 710, a correction coefficient generation circuit 720, and an observation receiver 730. The I/Q imbalance correction circuit 710 and the correction coefficient generation circuit 720 are configured to implement I/Q imbalance correction either in a frequency domain or in a time domain.

The I/Q imbalance correction circuit 710 receives I/Q data 702a/702b for transmission and modifies the I/Q data 702a/702b either in a frequency domain or time domain using correction coefficients to correct the I/Q imbalance. The I/Q imbalance correction circuit 710 modifies the input I/Q data 702a/702b in a frequency domain as in Equation (15) described below or in a time domain as in Equation (14) described below. The correction coefficients used in the I/Q imbalance correction circuit 710 are updated by the correction coefficient generation circuit 720.

The correction coefficient generation circuit 720 generates the correction coefficients for the I/Q imbalance correction circuit 710 based on the I/Q data 702a/702b and reference data 734. The reference data is obtained from an observation receiver 730. The I/Q data modified by the I/Q imbalance correction circuit 710 may be converted to an analog signal by a DAC 712a/712b and up-converted by the I/Q mixers 740a, 740b with a local oscillator signal from the LO 742, respectively. The up-converted I/Q signals are then combined and sent for further processing, such as filtering, amplification, etc., and then sent for transmission to an antenna panel, an MMIC, or an RFIC.

The transmit signal may be coupled onto the observation path 732 as a feedback signal. The observation receiver 730 processes the feedback signal and provides the reference data 734 to the correction coefficient generation circuit 720. The observation receiver 730 may be a main receiver of the apparatus 700 (e.g., one of a plurality of main receivers) or a separate receiver dedicated for the I/Q imbalance correction purposes. In some examples, the observation path 732 may be I/Q calibrated in advance, for example using pilot signals or reference symbols sent from a remote end.

The observation receiver 730 receives the feedback signal and down-converts the feedback signal with a pair of mixers 738a/738b with local oscillator signals from the LO 737. In this example, the frequency of the LO 737 is the same as the frequency of the LO 742 in the transmit path, i.e., the feedback signal is down-converted to a zero intermediate frequency and then processed to generate the reference data. The correction coefficient generation circuit 720 may adaptively generate the correction coefficients for the I/Q imbalance correction circuit 710 based on the reference data 734 and the I/Q data 702a/702b such that the I/Q imbalance correction circuit 710 corrects for amplitude and phase mismatch in an I/Q signal pair.

In one example, the phase of the local oscillator signal of the LO 737 may be shifted by a certain degree (e.g., 45°, 60°, 90°, etc.) and the observation receiver 730 may process the feedback signal with the phase-shifted LO signal. For example, the observation receiver 730 may down-convert the feedback signal using an LO signal without phase shift (i.e., 0° phase shift) for a first period of time and then down-convert the feedback signal with a phase-shifted LO signal (e.g., 45°, 60°, 90°, etc.) for a second period of time. This process may be repeated. As an example, the phase shifts may be any combination of two out of 0°, 45°, 60°, and 90°.

Figure 8:
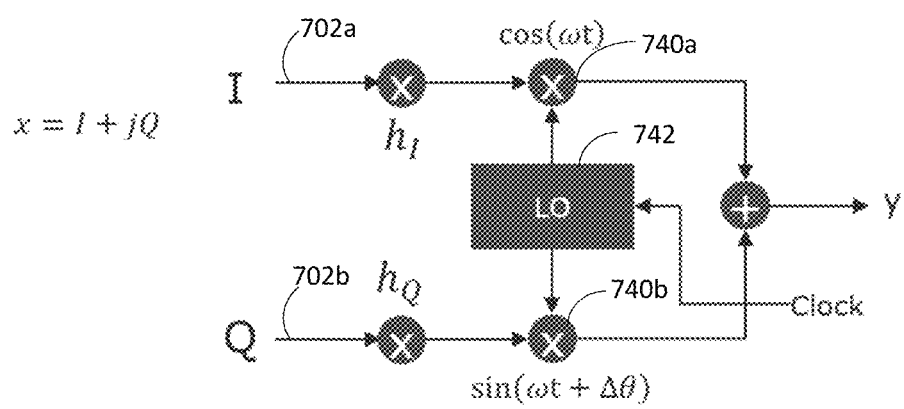
FIG. 8 illustrates an I/Q mismatch in a transmitter.

FIG. 8 illustrates an I/Q mismatch in a transmitter. The input I and Q data 702a/702b (x=I+jQ) is mixed by mixers 740a/740b with an I/Q local oscillator signal from an LO 742, respectively, and combined toy that can be written as follows:

$$y = Ih_I \frac{e^{j\omega t} + e^{-j\omega t}}{2} + Qh_Q \frac{e^{j(\omega t + \Delta\theta)} - e^{-j(\omega t + \Delta\theta)}}{2j} = $$
$$e^{j\omega t}\left(\frac{h_I I - jh_Q e^{j\Delta\theta} Q}{2}\right) + e^{-j\omega t}\left(\frac{h_I I + jh_Q e^{-j\Delta\theta} Q}{2}\right),$$

where $$u = ax + bx^* = aI + jaQ + bI - jbQ = (a+b)I + j(a-b)Q,$$

$$(a+b)I + j(a-b)Q = \frac{h_I I - jh_Q e^{j\Delta\theta} Q}{2},$$

$$a + b = \frac{h_I I}{2},$$

$$a - b = \frac{-jh_Q e^{j\Delta\theta} Q}{2},$$

$$x = I + jQ,$$

$$u = ax + bx^*,$$

$$y = e^{j\omega t} u + e^{-j\omega t} u^*,$$

$$a = \frac{h_I - h_Q e^{j\Delta\theta}}{4},$$

$$b = \frac{h_I + h_Q e^{j\Delta\theta}}{4},$$

where $h_I$ and $h_Q$ are single tap coefficients of an FIR model of I and Q channel.

Figure 9:
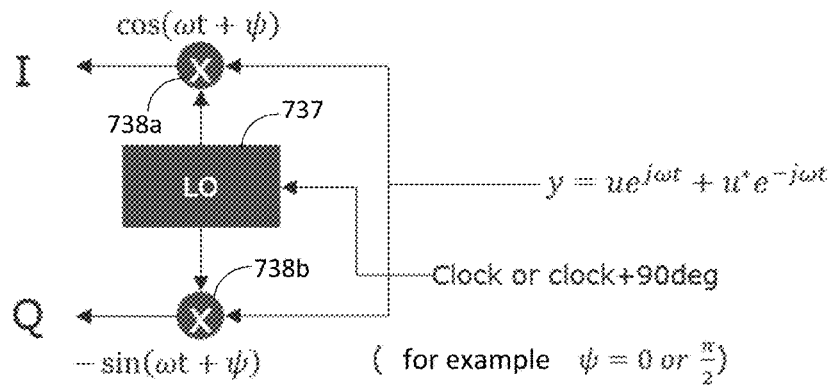
FIGS. 9 and 10 illustrate one example for calibration of transmitter with an observation receiver using a phase-shifted local oscillator signal.
Figure 10:
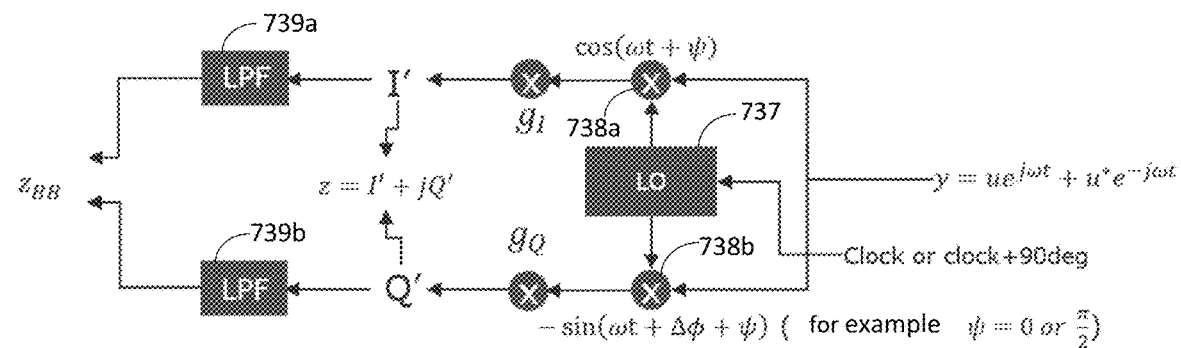

FIGS. 9 and 10 illustrate one example for calibration of transmitter with an observation receiver 730 using a phase-shifted local oscillator signal. As disclosed above with respect to FIG. 7, the clock signal supplied to the LO 737 may be (periodically or non-periodically) shifted by 90° (or any other degrees) to generate an LO signal with 90° (or any other degrees) phase shift, and the feedback signal may be mixed by the mixers 738a/738b with the LO signal without phase shift for a first period of time and mixed by the mixers 738a/738b with the LO signal with phase shift for a second period of time. This redundant measurement of the feedback signal using 0° and 90° (or any other degrees) phase-shifted LO signal is performed to distinguish the I/Q imbalance errors incurred in the observation receiver from the I/Q imbalance errors incurred in the transmit path.

The measurement (z) of the feedback signal at the observation receiver may be written as:

$$z = I' + jQ' = yg_I \frac{e^{j(\omega t + \psi)} + e^{-j(\omega t + \psi)}}{2} - jyg_Q \frac{e^{j(\omega t + \Delta\phi + \psi)} - e^{-j(\omega t + \Delta\phi + \psi)}}{2j} =$$
$$ye^{j\omega t}\left(\frac{g_I e^{j\psi} - g_Q e^{j(\Delta\phi + \psi)}}{2}\right) + ye^{-j\omega t}\left(\frac{g_I e^{-j\psi} + g_Q e^{-j(\Delta\phi + \psi)}}{2}\right).$$

$$z = (ue^{2j\omega t} + u^*)\left(\frac{g_I e^{j\psi} - g_Q e^{j(\Delta\phi + \psi)}}{2}\right) +$$
$$(u^* e^{-2j\omega t} + u)\left(\frac{g_I e^{-j\psi} + g_Q e^{-j(\Delta\phi + \psi)}}{2}\right).$$

The terms $ue^{2j\omega t}$ and $u^*e^{-2j\omega t}$ in the above equation can be removed by the low-pass filters 739a/739b. The baseband filtered output $z_{BB}$ is written as:

$$Z_{BB} = u^*\left(\frac{g_I e^{j\psi} - g_Q e^{j(\Delta\phi + \psi)}}{2}\right) + u\left(\frac{g_I e^{-j\psi} + g_Q e^{-j(\Delta\phi + \psi)}}{2}\right),$$

$$\psi = 0 \Rightarrow Z_{BB} = u^*\left(\frac{g_I - g_Q e^{j\Delta\phi}}{2}\right) + u\left(\frac{g_I + g_Q e^{-j\Delta\phi}}{2}\right) = \alpha u + \beta u^*,$$

$$\psi = \frac{\pi}{2} + \delta \Rightarrow Z_{BB} =$$
$$je^{j\delta} u^*\left(\frac{g_I - g_Q e^{j\Delta\phi}}{2}\right) - je^{-j\delta} u\left(\frac{g_I + g_Q e^{-j\Delta\phi}}{2}\right) = -je^{-j\delta}\alpha u + je^{j\delta}\beta u^*.$$

In accordance with some examples, two measurements (z and z') are made at the observation receiver 730 at two different times using zero and 90 degree (or any other non-zero degree) phase shifts, respectively. The two measurements (x,z) and (x',z') are written as:

$$u=ax+bx^*, z=\alpha u+\beta u^*, \text{and}$$

$$u'=ax'+bx'^*, z'=-je^{-j\delta}\alpha u'+je^{j\delta}\beta u'^*.$$

$$z=\alpha ax+\alpha bx^*+\beta a^*x^*+\beta b^*x=(\alpha a+\beta b^*)x+(\alpha b+\beta a^*)x^*,$$

$$z'=-je^{-j\delta}\alpha ax'-je^{-j\delta}\alpha bx'^*+je^{j\delta}\beta a^*x'^*+je^{j\delta}\beta b^*x'=j(-\alpha ae^{-j\delta}+\beta b^*e^{j\delta})x'+j(-\alpha be^{-j\delta}+\beta a^*e^{j\delta})x'^*.$$

In this example, the two measurements are performed with 0 and 90 degree phase shifts (alternatively, different degree of phase shifts may be used). x is the transmit signal, and z and z' are the observation receiver signals with 0 and 90 degree phase shifts, respectively. A numerical model for z and z' (e.g., using Least Squares) may be written as follows:

$$z=r_1x+r_2x^*, \text{ and}$$

$$z'=r_3x'+r_4x'^*.$$

z, z', x, x' are given. $r_1$, $r_2$, $r_3$, $r_4$ can be obtained by numerical regression for example using Least Squares algorithm.

$$\alpha a+\beta b^*=r_1, \quad \text{Equation (1)}$$

$$\alpha b+\beta a^*=r_2, \quad \text{Equation (2)}$$

$$\alpha ae^{-j\delta}-\beta b^*e^{j\delta}=jr_3, \text{ and} \quad \text{Equation (3)}$$

$$\alpha be^{-j\delta}-\beta a^*e^{j\delta}=jr_4. \quad \text{Equation (4)}$$

$r_1, r_2, r_3, r_4$ are now know and $\alpha, \beta, \delta, a, b$ can be obtained as follows:

$$a = \frac{r_1 + jr_3 e^{-j\delta}}{\alpha(1 + e^{-2j\delta})}, \quad \text{Equation (5)}$$

$$b = \frac{r_2 + jr_4 e^{-j\delta}}{\alpha(1 + e^{-2j\delta})}, \quad \text{Equation (6)}$$

$$b^* = \frac{r_1 - jr_3 e^{j\delta}}{\beta(1 + e^{2j\delta})}, \text{ and} \quad \text{Equation (7)}$$

$$a^* = \frac{r_2 - jr_4 e^{j\delta}}{\beta(1 + e^{2j\delta})}. \quad \text{Equation (8)}$$

$$\frac{r_1 + jr_3 e^{-j\delta}}{\alpha(1 + e^{-2j\delta})} = \frac{r_2^* + jr_4^* e^{-j\delta}}{\beta^*(1 + e^{-2j\delta})}, \frac{\beta^*}{\alpha} = \frac{r_2^* + jr_4^* e^{-j\delta}}{r_1 + jr_3 e^{-j\delta}}, \quad \text{Equation (9)}$$

$$\frac{r_1^* + jr_3^* e^{-j\delta}}{\beta(1 + e^{-2j\delta})} = \frac{r_2 + jr_4 e^{-j\delta}}{\alpha(1 + e^{-2j\delta})}, \frac{\beta^*}{\alpha} = \frac{r_1^* + jr_3^* e^{-j\delta}}{r_2 + jr_4 e^{-j\delta}}. \quad \text{Equation (10)}$$

From Equations (9) and (10), $$\frac{r_2^* + jr_4^* e^{-j\delta}}{r_1 + jr_3 e^{-j\delta}} = \frac{r_1^* + jr_3^* e^{-j\delta}}{r_2 + jr_4 e^{-j\delta}},$$

$$|r_1|^2 - |r_3|^2 e^{-2j\delta} + 2j\text{Re}(r_1 r_3^*) e^{-j\delta} = |r_2|^2 - |r_4|^2 e^{-2j\delta} + 2j\text{Re}(r_2 r_4^*) e^{-j\delta},$$

$$(|r_1|^2 - |r_2|^2) e^{2j\delta} + 2j\text{Re}(r_1 r_3^* - r_2 r_4^*) e^{j\delta} + (|r_4|^2 - |r_3|^2) = 0.$$

The above equation can be simplified, noticing the following property:

$$\frac{|r_1|^2 - |r_2|^2}{|r_3|^2 - |r_4|^2} = 1.$$

This can be proven by using the Equations (1)-(4):

$$\frac{|r_1|^2 - |r_2|^2}{|r_3|^2 - |r_4|^2} = \frac{|\alpha a + \beta b^*|^2 - |\alpha b + \beta a^*|^2}{|\alpha a + \beta b^* e^{2j\delta}|^2 - |\alpha b + \beta a^* e^{2j\delta}|^2},$$

$$\frac{|r_1|^2 - |r_2|^2}{|r_3|^2 - |r_4|^2} =$$

$$\frac{\substack{|\alpha|^2 |a|^2 + |\beta|^2 |b|^2 + \alpha a \beta^* b + \alpha^* a^* \beta b^* - \\ |\alpha|^2 |b|^2 - |\beta|^2 |a|^2 - \alpha b \beta^* a - \alpha^* b^* \beta a^*}}{\substack{|\alpha|^2 |a|^2 + |\beta|^2 |b|^2 - \alpha a \beta^* b e^{-2j\delta} - \alpha^* a^* \beta b^* e^{2j\delta} - \\ |\alpha|^2 |b|^2 - |\beta|^2 |a|^2 - \alpha b \beta^* a e^{-2j\delta} - \alpha^* b^* \beta a^* e^{2j\delta}}} = 1.$$

$e^{j\delta}$ is a solution of the equation (variable x):

$$x^2 + 2j \frac{\text{Re}(r_1 r_3^* - r_2 r_4^*)}{(|r_1|^2 - |r_2|^2)} x - 1 = 0.$$

$x = e^{j\delta}$, and $x = -e^{-j\delta}$, $$x^2 + (e^{j\delta} - e^{-j\delta})x - 1 = 0,$$

$$\frac{\text{Re}(r_1 r_3^* - r_2 r_4^*)}{(|r_1|^2 - |r_2|^2)} = \frac{(e^{j\delta} - e^{-j\delta})}{2j} = \sin(\delta),$$

$$\delta = \arcsin\left(\frac{\text{Re}(r_1 r_3^* - r_2 r_4^*)}{(|r_1|^2 - |r_2|^2)}\right) \approx \frac{\text{Re}(r_1 r_3^* - r_2 r_4^*)}{(|r_1|^2 - |r_2|^2)},$$

$$\delta \approx \frac{\text{Re}(r_1 r_3^* - r_2 r_4^*)}{(|r_1|^2 - |r_2|^2)}.$$

The above approximation valid because $\delta$ is small. From second order Taylor series approximation of exponential function:

$$e^{j\delta} \approx \left(1 - \frac{1}{2}\left(\frac{\text{Re}(r_1 r_3^* - r_2 r_4^*)}{(|r_1|^2 - |r_2|^2)}\right)^2\right) + j\frac{\text{Re}(r_1 r_3^* - r_2 r_4^*)}{(|r_1|^2 - |r_2|^2)}.$$

From Equations (5) and (6), $$a \to \frac{r_1 + jr_3 e^{-j\delta}}{2(1 + e^{-2j\delta})}, \text{ and } b \to \frac{r_2 + jr_4 e^{-j\delta}}{2(1 + e^{-2j\delta})}.$$

Dropping $\alpha$ in these equations is only resulting in a gain/phase scaling.

Figure 11:
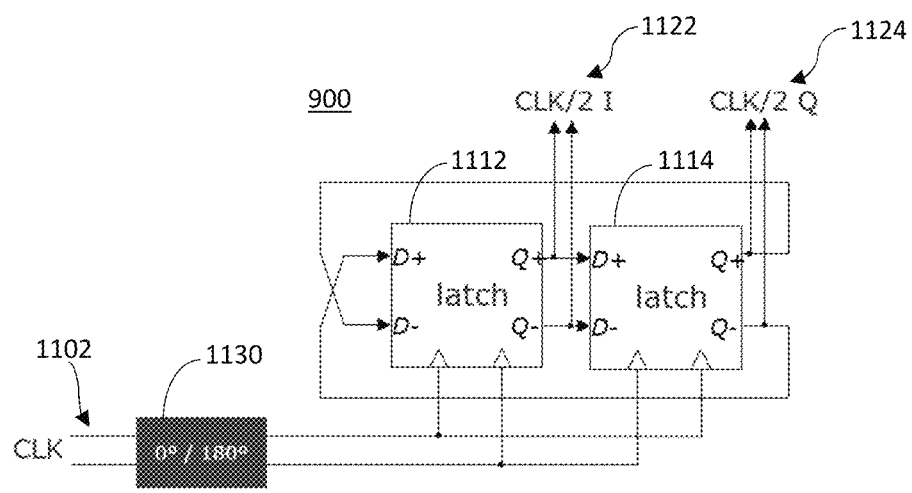
FIG. 11 is an example circuit 1100 for generating the 90° phase-shifted clock signal supplied to the local oscillator.

FIG. 11 is an example circuit 1100 for generating the 90° phase-shifted clock signal supplied to the local oscillator. The circuit 1100 includes two latches 1112, 1114 coupled in series such that an output of the first latch 1112 is directly coupled to an input of the second latch 1114 and an output of the second latch 1114 is cross-coupled to an input of the first latch 1112. Both the first and second latches 1112, 1114 are simultaneously clocked by a (differential) input clock signal 1102 but the input clock signal to the second latch 1114 is inverted. The first and second latches 1112, 1114 generate output clock signals 1122, 1124 (I/Q clock signals) with 90° phase difference at a half the frequency of the input clock signal 1102. The input clock signal 1102 may be inversed (e.g., periodically) to generate the 90° phase-shifted output clock signals 1122, 1124 that are supplied to the local oscillator 737. For example, the input clock signal 1102 may be inversed using a switch 1130 for swapping the differential input signal 1102.

Figure 12:
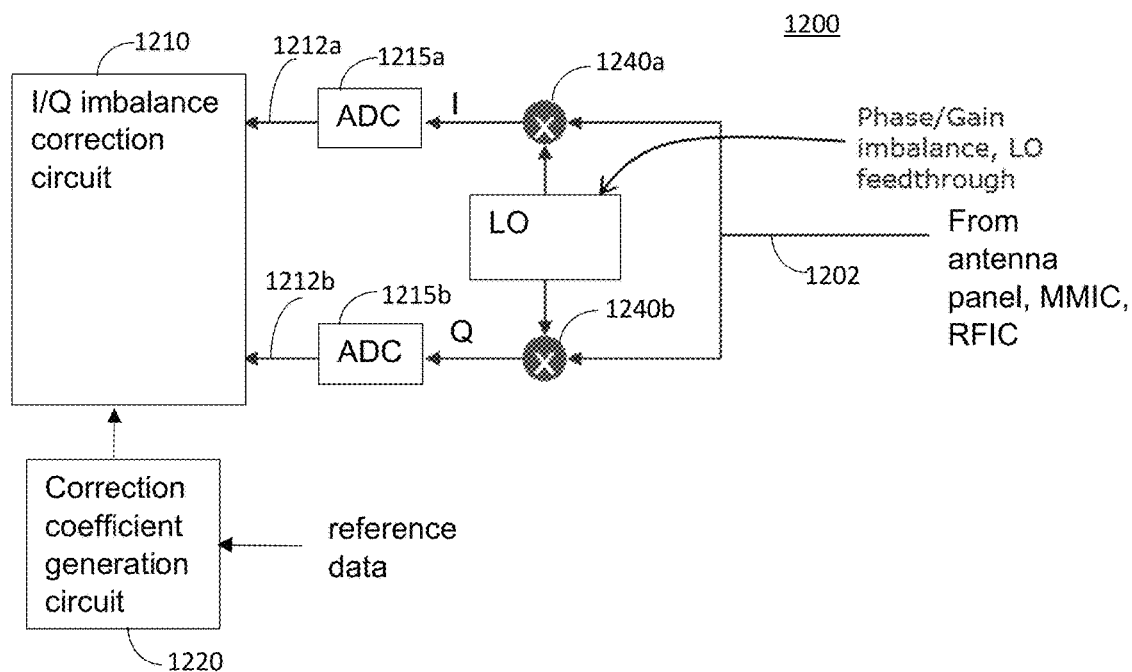
FIG. 12 is a schematic block diagram of an example receiver configured for I/Q imbalance correction in a frequency domain in accordance with one example.

FIG. 12 is a schematic block diagram of an example receiver 1200 configured for I/Q imbalance correction in a frequency domain in accordance with one example. The receiver 1200 includes an I/Q imbalance correction circuit 1210 and a correction coefficient generation circuit 1220. The I/Q imbalance correction circuit 1210 and the correction coefficient generation circuit 1220 are configured to implement I/Q imbalance correction in a frequency domain.

A received signal 1202 is down-converted by a mixer 1240a, 1240b and converted to a digital signal by an (RF) ADC 1215a, 1215b, respectively and then sent to the I/Q imbalance correction circuit 1210. The I/Q imbalance correction circuit 1210 modifies the I/Q data 1212a, 1212b in a frequency domain using correction coefficients to correct the I/Q imbalance. The I/Q imbalance correction circuit 1210 modifies the input I/Q data 1212a, 1212b in a frequency domain as in Equation (15) described below. The correction coefficients used in the I/Q imbalance correction circuit 1210 are updated by the correction coefficient generation circuit 1220.

The correction coefficient generation circuit 1220 generates the correction coefficients for the I/Q imbalance correction circuit 1210 based on the reference data. The reference data may be pre-configured data, such as a pilot signal, a reference symbol, a training signal, or the like, carried in the received signal. The receiver knows the pre-configured data and based on the received reference data in the received signal, the correction coefficient generation circuit 1220 may generate the correction coefficients for the I/Q imbalance correction circuit 1210. Alternatively, a signal transmitted from the transmitter and captured via an observation path may be used to calibrate the main receiver instead of using a pilot signal or reference symbols in the received signal.

Figure 13:
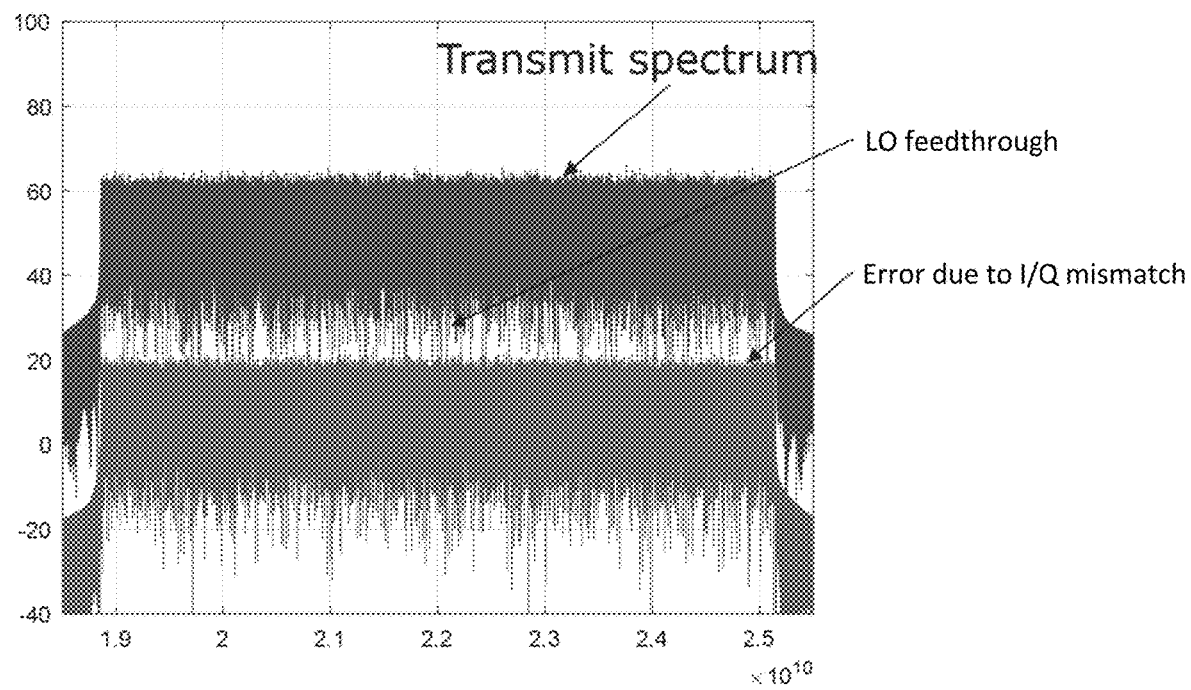
FIG. 13 shows an example simulation results showing a transmit spectrum, an LO feedthrough, and an error due to I/Q mismatch.

FIG. 13 shows an example simulation results showing a transmit spectrum, an LO feedthrough, and an error due to I/Q mismatch. The simulation is based on LO gain mismatch 5%, phase mismatch (skew) 300 fs, LOFT −40 dBc, IQ channel mismatch 5%, reflection on IQ traces −10 dB, trace impulse tau 100 psec, DAC effective number of bits (ENOB) 11 bits.

The I/Q imbalance correction (without frequency dependence) may be expressed as follows:

$$y = (\alpha_0 x_r + \alpha_1 x_i) + j(\alpha_2 x_r + \alpha_3 x_i), \quad \text{Equation (11)}$$

wherein x ($x_r$ is a real component and $x_i$ is an imaginary component of x) is the input data to the IQ imbalance correction circuit, $\alpha_0$, $\alpha_1$, $\alpha_2$, $\alpha_3$ are I/Q correction coefficients, and y is the output data from the I/Q imbalance correction circuit.

Equation (11) can be rewritten using complex multiplications as follows:

$$\hat{y} = ax + bx^*, \quad \text{Equation (12)}$$

$$\hat{y} = ((a_r + b_r)x_r - (a_i - b_i)x_i) + j((a_i + b_i)x_r - (a_r - b_r)x_i), \quad \text{Equation (13)}$$

where a ($= a_r + j a_i$) and b ($= b_r + j b_i$) are complex coefficients, and x* is a complex conjugate of x,
where $$a_r + b_r = \alpha_0,$$

$$a_r - b_r = \alpha_3,$$

$$a_i + b_i = \alpha_2, \text{ and}$$

$$a_i - b_i = \alpha_1,$$

$$a_r = \frac{\alpha_0 + \alpha_3}{2},$$

$$a_i = \frac{\alpha_2 + \alpha_1}{2},$$

$$b_r = \frac{\alpha_0 - \alpha_3}{2}, \text{ and}$$

$$b_i = \frac{\alpha_2 - \alpha_1}{2}.$$

The I/Q imbalance correction model with memory effect may be written as follows:

$$y_n = \sum_{k=0}^{N_{imp}} \alpha_k x_{n-k} + \beta_k x^*_{n-k}. \quad \text{Equation (14)}$$

In accordance with examples disclosed herein, the I/Q imbalance correction may be performed in a frequency domain. If the I/Q imbalance correction is implemented in a time domain, the I/Q mismatch over a wide frequency may need correction with an FIR filter with many taps, and this requires a high complexity. The complexity of the filter implementation and power consumption increase quadratically with the bandwidth.

For the I/Q imbalance correction in a frequency domain, the terms in Equation (14) are converted to a frequency domain as follows:

$$Y(f) = A(f)X(f) + B(f)X(-f), \quad \text{Equation (15)}$$

wherein Y(f) is the corrected I/Q data in a frequency domain, X(f) is the I/Q data before I/Q imbalance correction in a frequency domain, X*(−f) is a complex conjugate of the I/Q data before I/Q imbalance correction in a frequency domain at a mirror image frequency, A(f) and B(f) are the correction coefficients in a frequency domain.

Figure 14A:
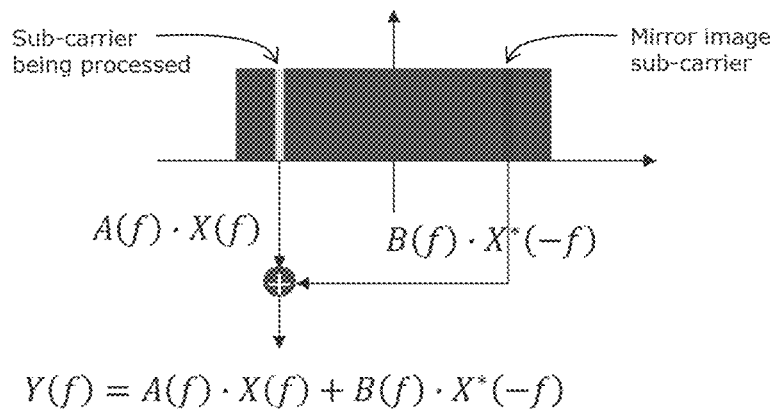
FIG. 14A shows the concept of I/Q imbalance correction in a frequency domain.

FIG. 14A shows the concept of I/Q imbalance correction in a frequency domain as in Equation (15). The frequency domain correction coefficients A(f) and B(f) and the I/Q data and the mirror image data are multiplied, respectively, and summed to generated I/Q imbalance corrected data in a frequency domain.

Figure 14B:
FIG. 14B shows an example OFDM symbol with a cyclic prefix.

In an orthogonal frequency division multiplex (OFDM) system, a cyclic prefix is attached to an OFDM symbol. The cyclic prefix needs to be long enough to absorb the impulse response mismatch span (e.g. 100 psec) of the I/Q imbalance channel (e.g. from the output of the I/Q imbalance correction circuit to the mixer). For the frequency domain I/Q imbalance correction, a cyclic prefix of the OFDM symbol should be longer than the impulse response length of the I/Q imbalance channel. As an example, 288 points of cyclic prefix attached to the 4096 points of OFDM symbol is shown in FIG. 14B.

Figure 15:
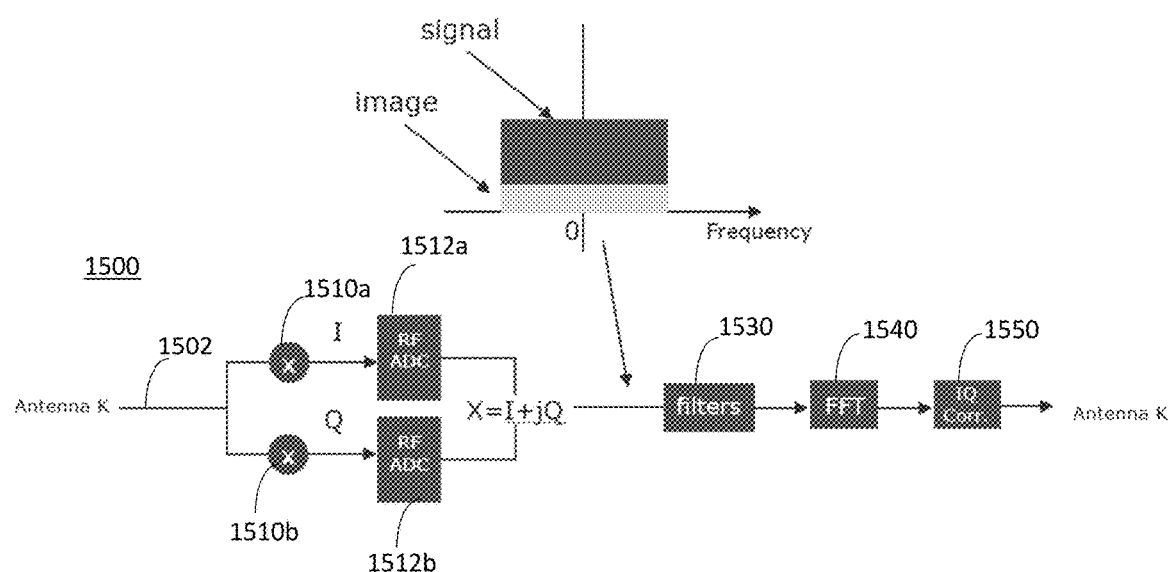
FIG. 15 is a block diagram of an example receiver configured for I/Q imbalance correction in a frequency domain in case of zero IF in accordance with one example.

FIG. 15 is a block diagram of an example receiver 1500 configured for I/Q imbalance correction in a frequency domain in case of zero IF in accordance with one example. The receiver 1500 may include a plurality of mixers 1510 and RF ADCs 1512 and one or more processing chains (only one processing chain is shown in FIG. 15 as an example) including a filter 1530, an FFT circuit 1540, and an I/Q imbalance correction circuit 1550.

A received signal 1502 via an antenna may be converted to I and Q signals in baseband (zero IF) by a pair of mixers 1510*a*, 1510*b* and then digitized by a pair of ADCs 1512*a*, 1512*b*. The digitized I/Q data is filtered by a filter 1530. The filtered I/Q data in baseband is then converted to a frequency domain by a fast Fourier transform (FFT) circuit 1540 and then the I/Q imbalance on the I/Q data is corrected by the I/Q imbalance correction unit 1550 in a frequency domain. In this example, since the received signal is down-converted to zero IF, the signal of interest and the image of the signal of interest are both in the baseband. The signal spectrum after down-coversion to zero IF is shown in FIG. 15. The I/Q imbalance correction circuit 1550 modifies the I/Q data in a frequency domain using the correction coefficients as in Equation (15) described above.

Figure 16A:
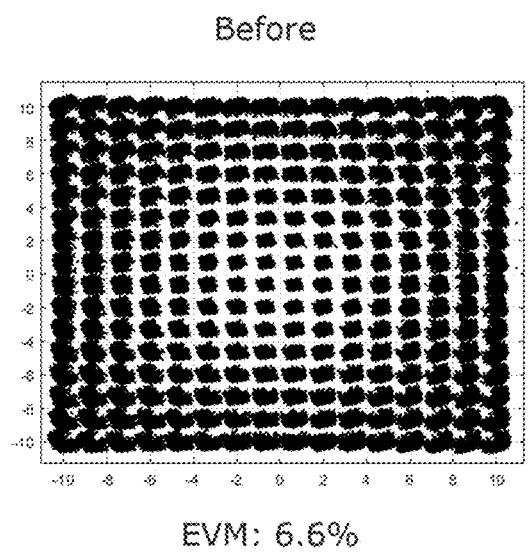
FIGS. 16A and 16B show simulation results of error vector magnitudes before and after I/Q imbalance correction.
Figure 16B:
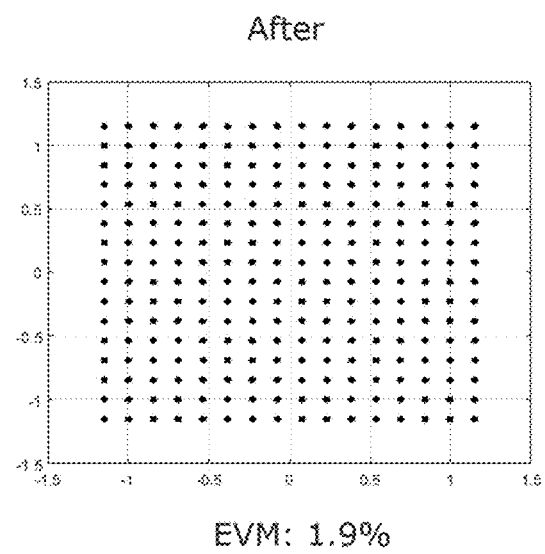

FIGS. 16A and 16B show simulation results of error vector magnitudes before and after I/Q imbalance correction. This simulation is based on LO gain mismatch 5%, phase mismatch (skew) 300 fs, LO feed-through (LOFT) −40 dBc, IQ channel mismatch 10%, reflection on IQ traces −10 dB, trace impulse tau 100 ps, DAC effective number of bits (ENOB) 11 bits.

Figures 17A, 17B:
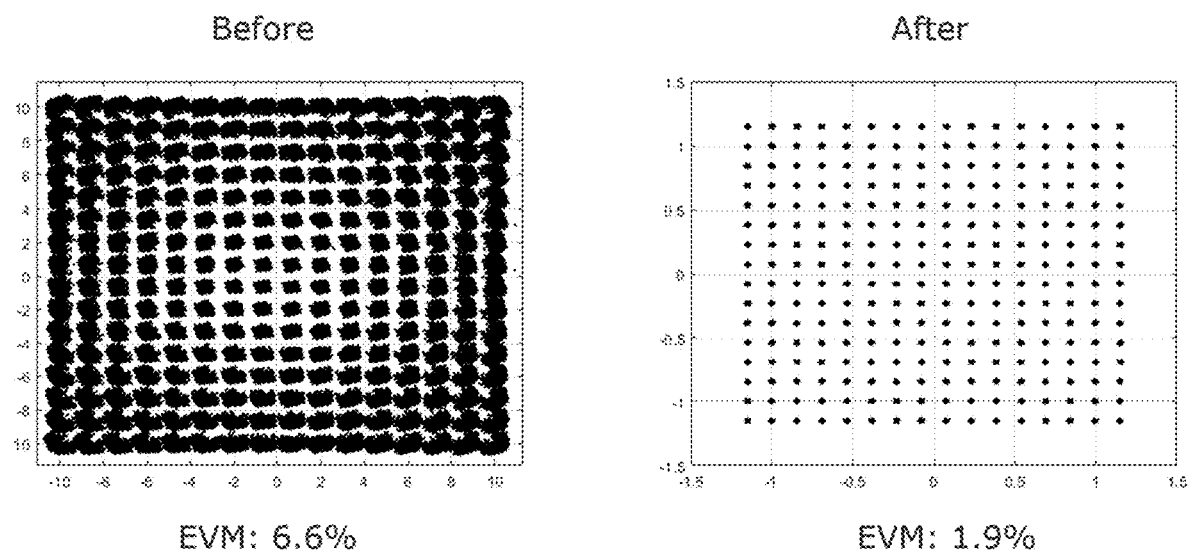
FIGS. 17A and 17B show another simulation results of error vector magnitudes before and after I/Q imbalance correction.

FIGS. 17A and 17B show another simulation results of error vector magnitudes before and after I/Q imbalance correction. This simulation is based on LO gain mismatch 5%, phase mismatch (skew) 300 fs, LOFT −40 dBc, IQ channel mismatch 5%, reflection on IQ traces −10 dB, trace impulse tau 50 ps, DAC effective number of bits (ENOB) 16 bits.

In a transmitter, the transmit signal and the image of the transmit signal are known at the input of the DAC, and there are no blockers. A blocker is an of frequency signal that causes the signal of interest to be suppressed. Therefore, the I/Q imbalance correction for a transmitter is more straight-forward than a receiver. In contrast, in a receiver, the signal of interest is not known a priori and there may be a blocker at the image frequency of the signal of interest. This may complicate the I/Q imbalance correction for a receive path.

Figure 18A:
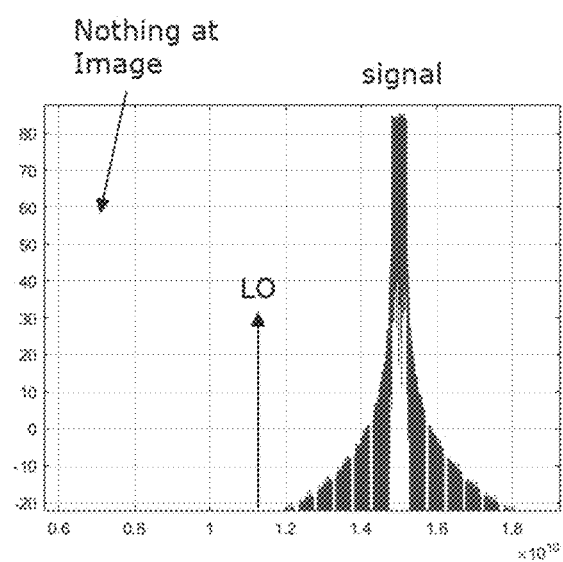
FIGS. 18A and 18B show the spectrum for the case that there is no blocker at the image frequency of the desired signal.
Figure 18B:
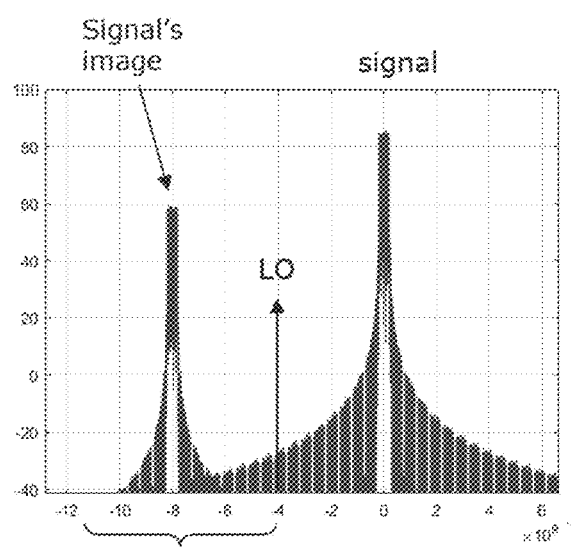
Figure 18C:
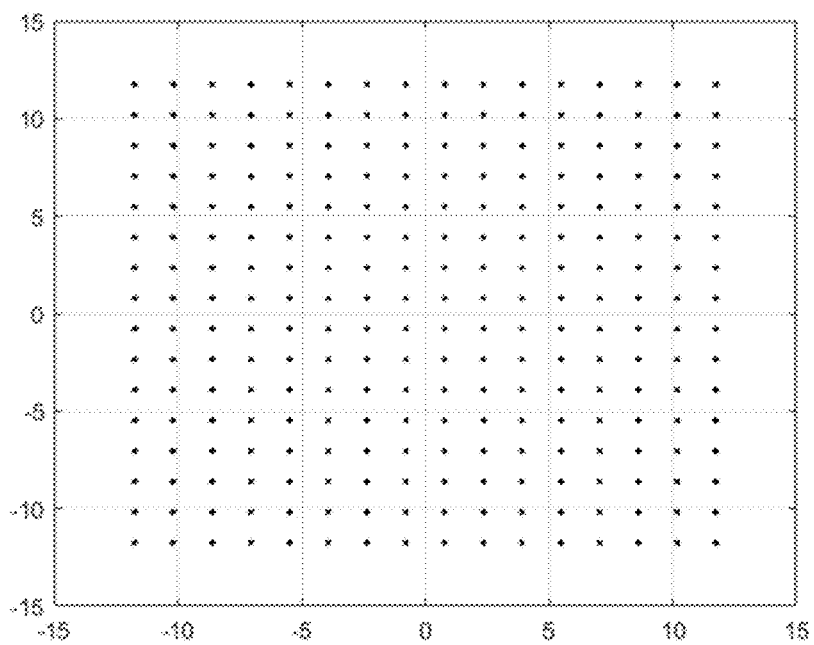
FIG. 18C shows the simulation result.

FIGS. 18A and 18B show the spectrum for the case that there is no blocker at the image frequency of the desired signal (the signal of interest). For demodulation of the signal of interest, the image signal may be filtered out and only the signal of interest may be sent for the baseband processing. FIG. 18C shows the simulation result for this example. In case of no blocker at the signal's image frequency band, the EVM of 0.2% is obtained without I/Q imbalance correction.

Figure 19:
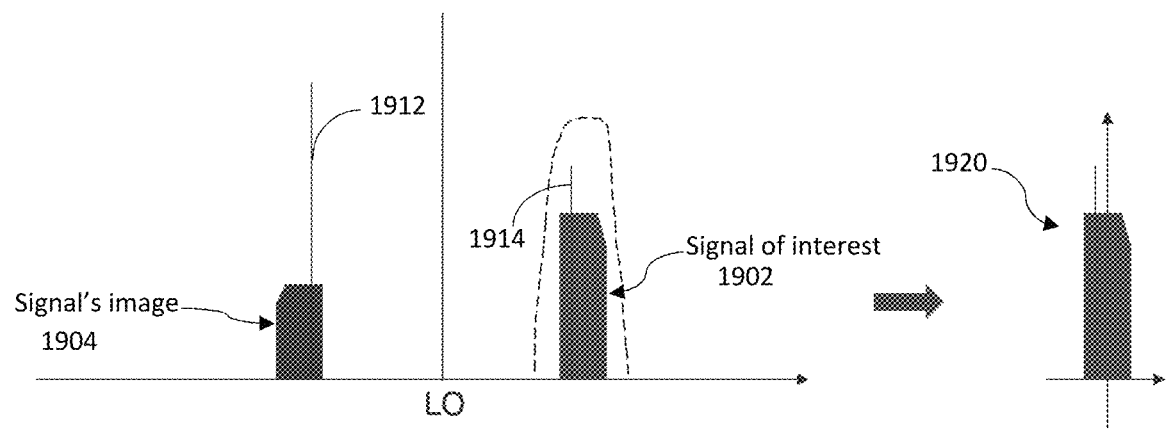
FIG. 19 shows the spectrum for the case that there is a blocker at the image frequency of the signal of interest.

FIG. 19 shows the spectrum for the case that there is a blocker at the image frequency of the signal of interest. As shown in FIG. 19, after the received signal is mixed with an LO signal, the signal's image 1904 will overlap with the blocker 1912, and the blocker's image 1914 will overlap with the signal of interest 1902.

In one example, the entire spectrum may be digitized by an RF ADC and the signal of interest may be filtered in a digital domain (e.g., by a digital down-converter) and sent to the I/Q imbalance correction circuit (indicated as 1920). After down-sampling filter, the image of the signal of interest will be lost. Therefore, in examples, the image frequency band of the signal of interest is also down-converted (e.g., by the digital down-converter) and filtered and sent to the I/Q imbalance correction circuit for I/Q imbalance correction. The I/Q imbalance correction circuit then modifies the received signal in a digital domain based on both the signal and image I/Q data in accordance with Equation (15).

FIGS. 20A and 20B show a signal of interest, an LO signal, and a blocker at the image frequency of the signal of interest. As shown in FIG. 20B, the blocker folds in the frequency of the signal of interest and the image of the signal of interest also folds in the blocker frequency. As disclosed above, in some examples, the entire spectrum may be digitized by an RF ADC and the digitized signal may be down-converted and filtered for the signal of interest in a digital domain and sent to the I/Q imbalance correction circuit. In addition, the digitized signal may also be down-converted and filtered for the image frequency band and sent to the IQ imbalance correction circuit. The I/Q imbalance correction circuit then modifies the received I/Q data in a digital domain in accordance with Equation (15).

Figure 21:
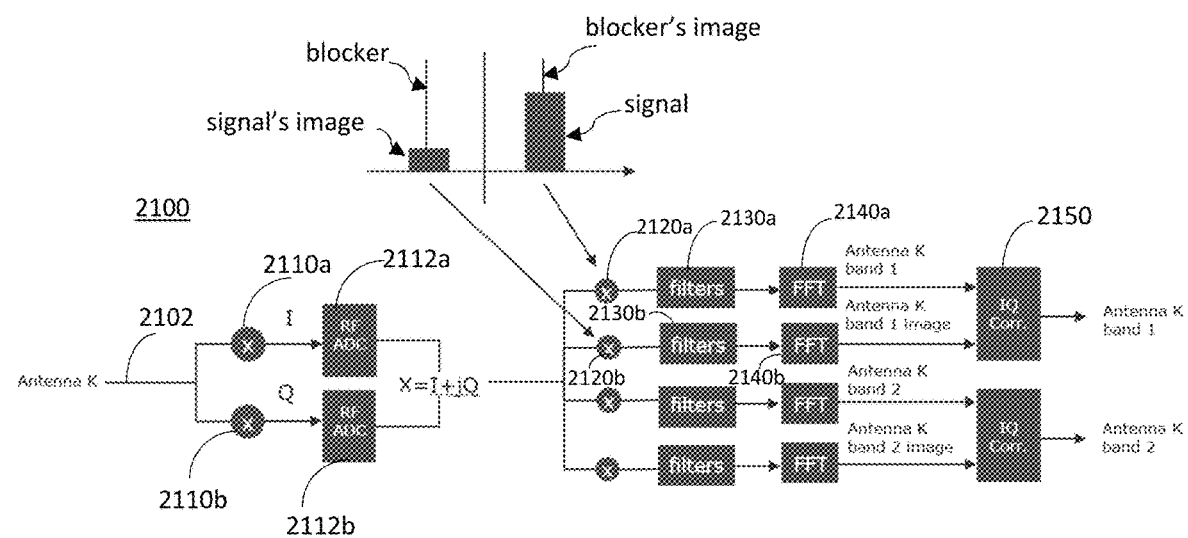
FIG. 21 is a block diagram of an example receiver configured for I/Q imbalance correction in a frequency domain in case of non-zero IF in accordance with one example.

FIG. 21 is a block diagram of an example receiver 2100 configured for I/Q imbalance correction in a frequency domain in case of non-zero IF in accordance with one example. The receiver 2100 may include a plurality of mixers 2110 and RF ADCs 2112 and a plurality of processing chains (4 in this example) including a mixer 2120, a filter 2130, an FFT circuit 2140, and an I/Q imbalance correction circuit 2150 for a plurality of frequency bands (four frequency bands in this example). As shown in FIGS. 3 and 4, the receiver 2100 may include any number of ADCs and processing chains for processing any number of frequency bands.

A received signal 2102 via an antenna may be converted to I and Q signals in non zero IF by a pair of mixers 2110a, 2110b and then digitized by a pair of RF ADCs 2112a, 2112b. The digitized I/Q data are down-converted by digital down-converters 2120a, 2120b from a non-zero IF to baseband in this example. The down-converted I/Q data is filtered by filters 2130a, 2130b for a specific frequency band, and then converted to a frequency domain by FFT units 2140a, 2140b. The I/Q imbalance on the I/Q data is then corrected by the I/Q imbalance correction unit 2150.

In this example, the digitized I/Q data is down-converted to non-zero IF. The spectrum after the down-conversion including the signal, the signal's image, the blocker, and the blocker's image is also shown in FIG. 21. The digitized I/Q data 2114 output from the RF ADC 2112a, 2112b is down-converted by a digital mixer 2120a for the frequency band of the signal of interest and filtered by a filter 2130a and converted to a frequency domain by the FFT unit 2140a and sent to the I/Q imbalance correction circuit 2150. In addition, the digitized I/Q data 2114 is down-converted by a digital mixer 2120b for the image frequency band of the signal of interest and filtered by a filter 2130b and converted to a frequency domain by the FFT unit 2140b and sent to the I/Q imbalance correction circuit 2150. The I/Q imbalance correction circuit 2150 modifies the I/Q data of the signal of interest based on the I/Q data for the image frequency of the signal of interest as in Equation (15). As shown in FIG. 21, a pair of processing chains of the mixer 2120a, 2120b, filter 2130a, 2130b, and FFT circuit 2340a, 2140b are used for I/Q imbalance correction for each frequency band. FIG. 21 shows only a signal from one antenna and processing chains for two frequency bands, but the apparatus 2100 may process received signals from any number of antennas and for any number of frequency bands.

Figure 22:
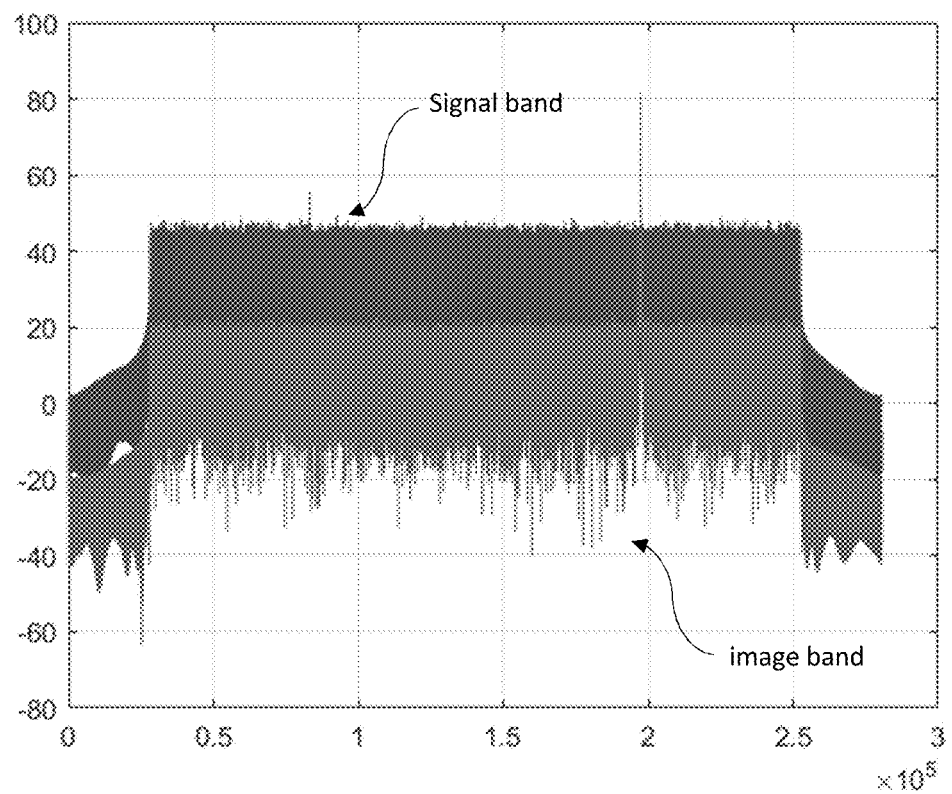
FIG. 22 shows the signal band and the image band.

FIG. 22 shows the signal band and the image band. FIGS. 23A and 23B show simulation results of error vector magnitudes before and after IQ imbalance correction in example case shown in FIG. 21. The simulation results show 0.26% of EVM after IQ imbalance correction.

Figure 24A:
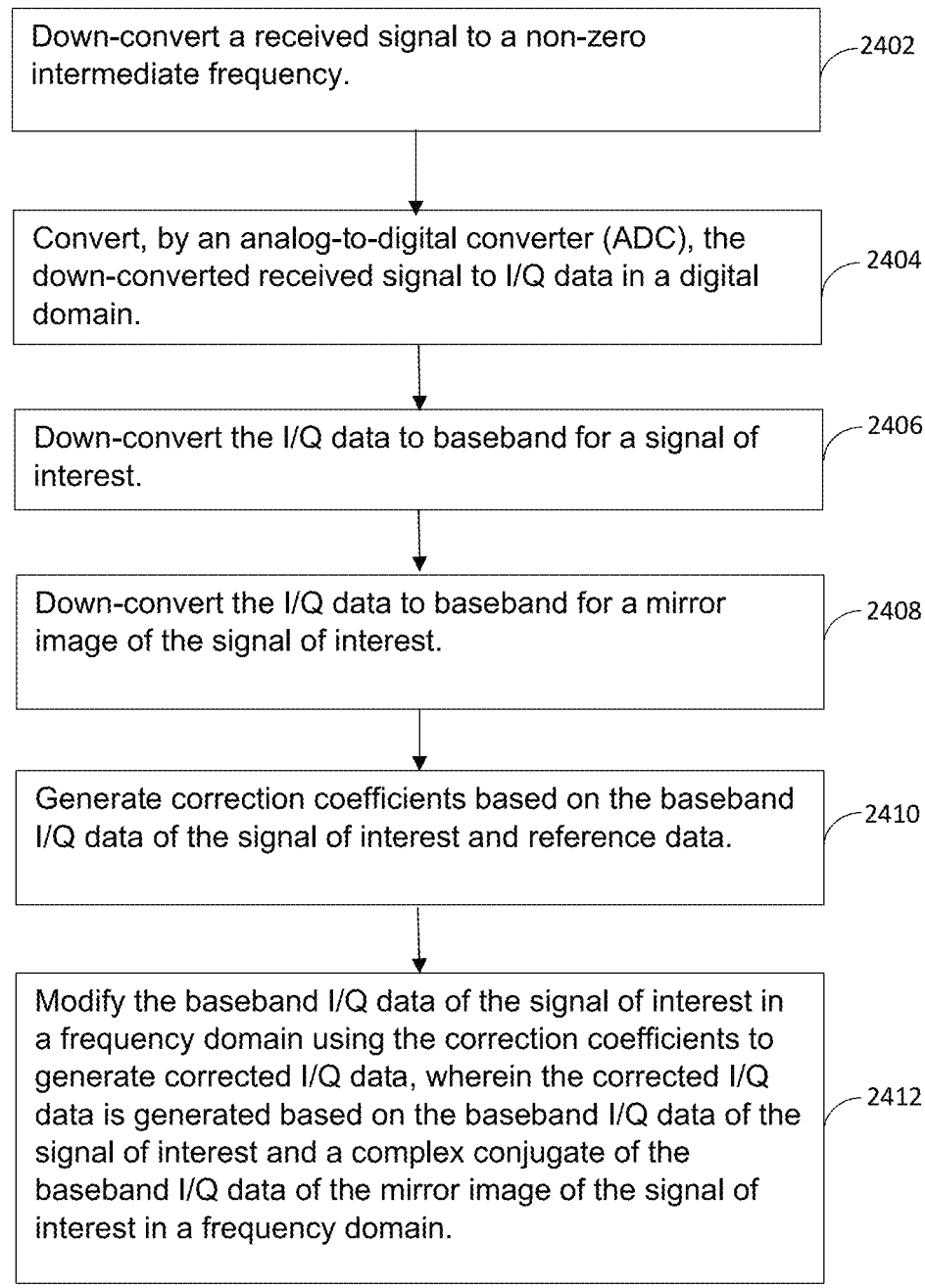
FIGS. 24A and 24B are flow diagrams of a method for I/Q imbalance correction in a transceiver.

FIG. 24A is a flow diagram of a method for I/Q imbalance correction in a transceiver. A received signal is down-converted to a non-zero intermediate frequency (2402). By an ADC, the down-converted received signal is converted to I/Q data in a digital domain (2404). The I/Q data is down-converted to baseband for a signal of interest (2406). The I/Q data is also down-converted to baseband for a mirror image of the signal of interest (2408). Correction coefficients are generated based on the baseband I/Q data of the signal of interest and reference data (2410). The baseband I/Q data of the signal of interest is modified in a frequency domain using the correction coefficients to generate corrected I/Q data. (2412). The corrected I/Q data is generated based on the baseband I/Q data of the signal of interest and a complex conjugate of the baseband I/Q data of the mirror image of the signal of interest in a frequency domain. The corrected I/Q data may be generated based on the I/Q data and a complex conjugate of the I/Q data at a mirror image frequency in a frequency domain. For example, the corrected I/Q data may be generated as:

$$Y(f)=A(f)X(f)+B(f)X^*(-f).$$

$Y(f)$ is the corrected I/Q data in a frequency domain, $X(f)$ is the I/Q data before I/Q imbalance correction in a frequency domain, $X^*(-f)$ is a complex conjugate of the I/Q data at a mirror image frequency before I/Q imbalance correction in a frequency domain, $A(f)$ and $B(f)$ are the correction coefficients in a frequency domain.

The I/Q data may be transmit data for transmission. An observation receiver may receive an analog transmit signal of the corrected I/Q data and generate the reference data based on the analog transmit signal. The observation receiver may be one of main receivers of the transceiver or a separate dedicated receiver.

The I/Q data may be data obtained from a received signal and the reference data may be pre-configured data carried in the received signal. The received signal may be down-converted to a zero intermediate frequency or a non-zero intermediate frequency. The mirror image frequency of a signal of interest may be down-converted and sent to the I/Q imbalance correction circuit to generate the corrected I/Q data.

Figure 24B:
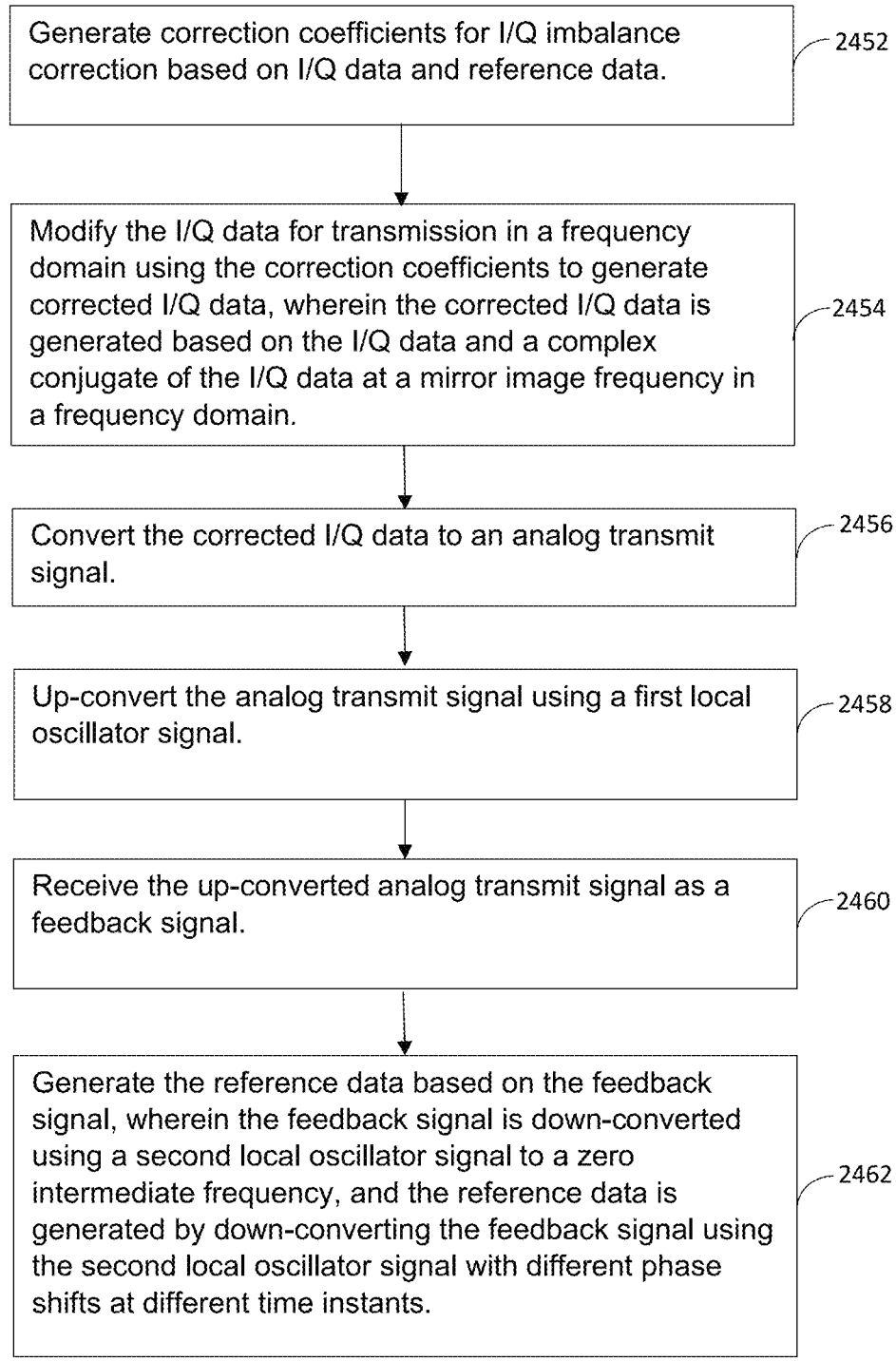

FIG. 24B is a flow diagram of another method for I/Q imbalance correction in a transceiver. Correction coefficients are generated for I/Q imbalance correction based on I/Q data and reference data (2502). The I/Q data is modified for transmission in a frequency domain using the correction coefficients to generate corrected I/Q data, wherein the corrected I/Q data is generated based on the I/Q data and a complex conjugate of the I/Q data at a mirror image frequency in a frequency domain (2504). The corrected I/Q data is converted to an analog transmit signal (2506). The analog transmit signal is up-converted using a first local oscillator signal (2508). The up-converted analog transmit signal is received as a feedback signal (2510). The reference data is generated based on the feedback signal, wherein the feedback signal is down-converted using a second local oscillator signal to a zero intermediate frequency, and the reference data is generated by down-converting the feedback signal using the second local oscillator signal with different phase shifts at different time instants (2512).

Figure 25:
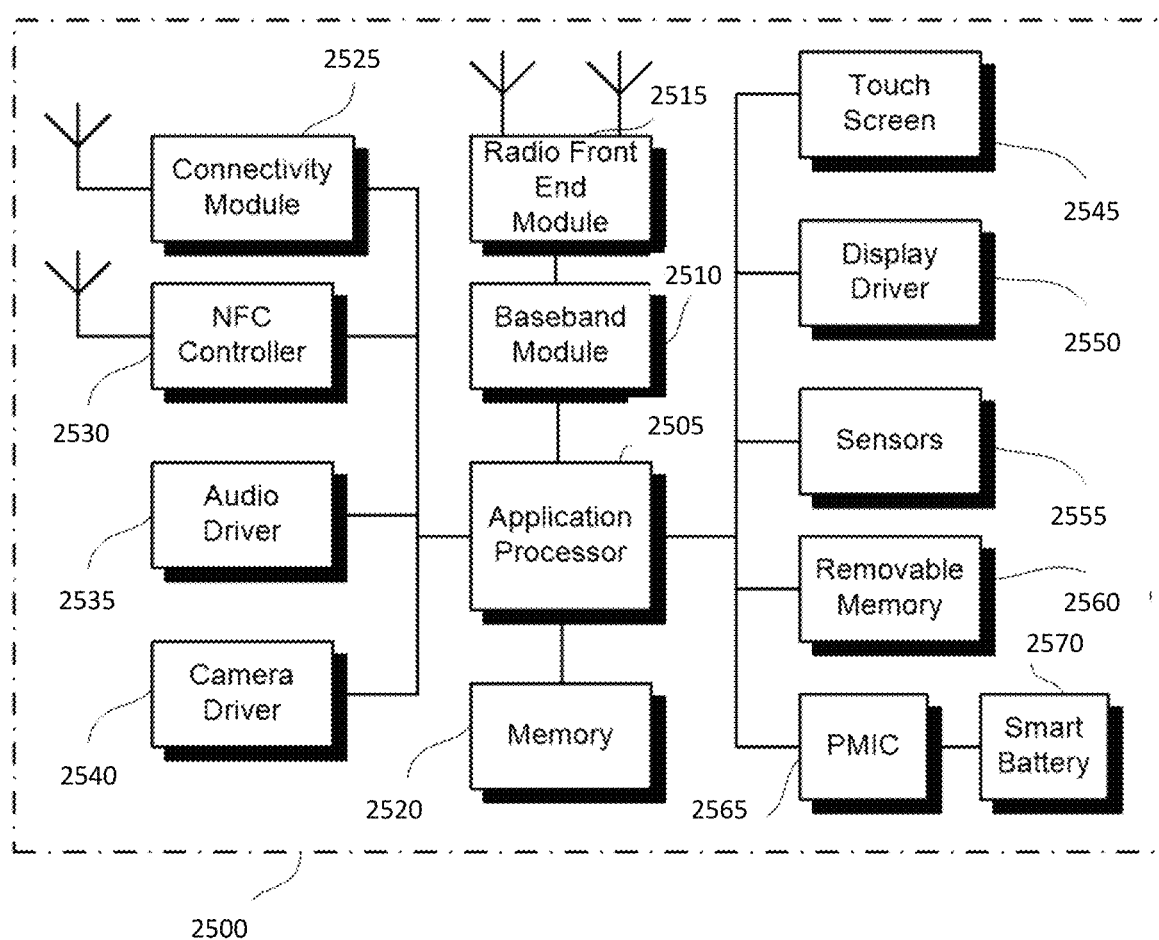
FIG. 25 illustrates a user device in which the examples disclosed herein may be implemented.

FIG. 25 illustrates a user device 2500 in which the examples disclosed herein may be implemented. For example, the examples disclosed herein may be implemented in the radio front-end module 2515, in the baseband module 2510, etc. The user device 2500 may be a mobile device in some aspects and includes an application processor 2505, baseband processor 2510 (also referred to as a baseband module), radio front end module (RFEM) 2515, memory 2520, connectivity module 2525, near field communication (NFC) controller 2530, audio driver 2535, camera driver 2540, touch screen 2545, display driver 2550, sensors 2555, removable memory 2560, power management integrated circuit (PMIC) 2565 and smart battery 2570.

In some aspects, application processor 2505 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 2510 may be implemented, for example, as a solder-down substrate including one or more integrated circuits, a single packaged integrated circuit soldered to a main circuit board, and/or a multi-chip module containing two or more integrated circuits.

Figure 26:
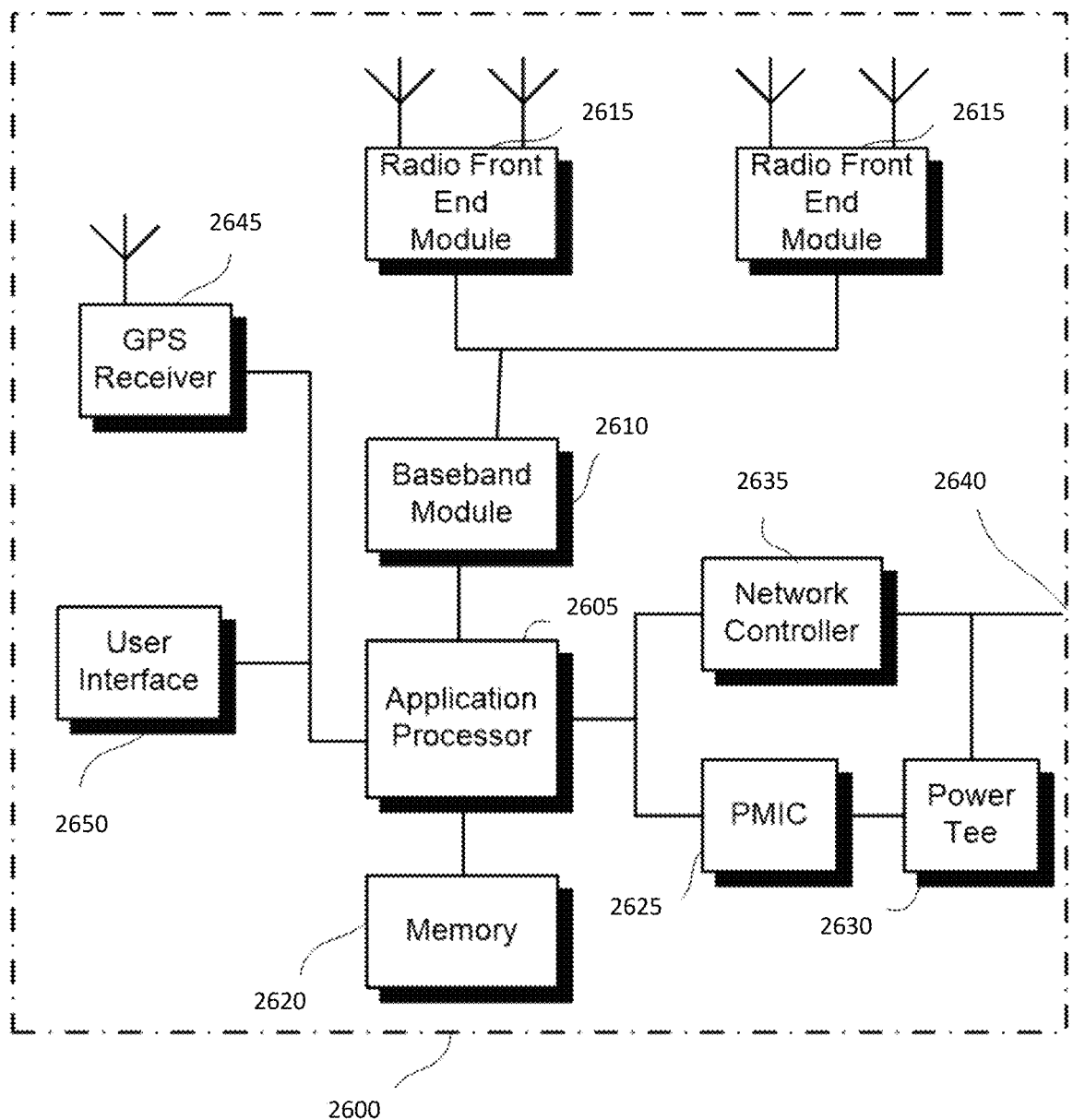
FIG. 26 illustrates a base station or infrastructure equipment radio head 2600 in which the examples disclosed herein may be implemented.

FIG. 26 illustrates a base station or infrastructure equipment radio head 2600 in which the examples disclosed herein may be implemented. For example, the examples disclosed herein may be implemented in the radio front-end module 2615, in the baseband module 2610, etc. The base station radio head 2600 may include one or more of application processor 2605, baseband modules 2610, one or more radio front end modules 2615, memory 2620, power management circuitry 2625, power tee circuitry 2630, network controller 2635, network interface connector 2640, satellite navigation receiver module 2645, and user interface 2650.

In some aspects, application processor 2605 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 2610 may be implemented, for example, as a solder-down substrate including one or more integrated circuits, a single packaged integrated circuit soldered to a main circuit board or a multi-chip module containing two or more integrated circuits.

In some aspects, memory 2620 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 920 may be implemented as one or more of solder down packaged integrated circuits, socketed memory modules and plug-in memory cards.

In some aspects, power management integrated circuitry 2625 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 2630 may provide for electrical power drawn from a network cable to provide both power supply and data connectivity to the base station radio head 2600 using a single cable.

In some aspects, network controller 2635 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 2645 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 2645 may provide data to application processor 2605 which may include one or more of position data or time data. Application processor 2605 may use time data to synchronize operations with other radio base stations.

In some aspects, user interface 2650 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is an apparatus for I/Q imbalance correction in a transceiver. The apparatus includes an analog mixer circuit configured to down-convert a received signal to a non-zero intermediate frequency, an ADC configured convert the down-converted received signal to I/Q data in a digital domain, a first down-conversion circuit configured to down-convert the I/Q data to baseband for a signal of interest, a second down-conversion circuit configured to down-convert the I/Q data to baseband for a mirror image of the signal of interest, an I/Q imbalance correction circuit configured to modify the baseband I/Q data of the signal of interest in a frequency domain using correction coefficients to generate corrected I/Q data, and a correction coefficient generation circuit configured to generate the correction coefficients for the I/Q imbalance correction circuit based on the baseband I/Q data of the signal of interest and reference data. The I/Q imbalance correction circuit is configured to generate the corrected I/Q data based on the baseband I/Q data of the signal of interest and a complex conjugate of the baseband I/Q data of the mirror image of the signal of interest in a frequency domain.

Example 2 is the apparatus of example 1, wherein the ADC is an RF ADC configured to digitize the down-converted received signal over a frequency of the signal of interest and a frequency of the mirror image of the signal of interest.

Example 3 is the apparatus as in any one of examples 1-2, wherein the received signal is an OFDM modulated signal and a cyclic prefix attached to an OFDM symbol is longer than an impulse response length of an I/Q imbalance channel.

Example 4 is the apparatus as in any one of examples 1-3, wherein the I/Q imbalance correction circuit is further configured to perform RF equalization.

Example 5 is the apparatus as in any one of examples 1-4, wherein the reference data is obtained from a pilot signal, a reference symbol, or a training sequence included in the received signal.

Example 6 is an apparatus for I/Q imbalance correction in a transceiver. The apparatus includes an I/Q imbalance correction circuit configured to modify I/Q data for transmission using correction coefficients to generate corrected I/Q data, wherein the I/Q imbalance correction circuit is configured to generate the corrected I/Q data based on the I/Q data and a complex conjugate of the I/Q data at a mirror image frequency, a correction coefficient generation circuit configured to generate the correction coefficients for the I/Q imbalance correction circuit based on the I/Q data and reference data, a DAC configured to convert the corrected I/Q data to an analog transmit signal, a first mixer circuit for up-converting the analog transmit signal using a first local oscillator signal, and an observation receiver configured to receive the up-converted analog transmit signal as a feedback signal and generate the reference data based on the feedback signal. The observation receiver may include a second mixer circuit configured to down-convert the feedback signal using a second local oscillator signal to a zero intermediate frequency, wherein the observation receiver is configured to generate the reference data by down-converting the feedback signal using the second local oscillator signal with different phase shifts at different time instants.

Example 7 is the apparatus of example 6, wherein the phase shifts are any combination of two out of 0°, 45°, 60°, or 90°.

Example 8 is the apparatus as in any one of examples 6-7, wherein the I/Q data is an OFDM modulated data and a cyclic prefix attached to an OFDM symbol is longer than an impulse response length of an I/Q imbalance channel.

Example 9 is the apparatus as in any one of examples 6-8, wherein the I/Q imbalance correction circuit is further configured to perform RF equalization.

Example 10 is a method for I/Q imbalance correction in a transceiver. The method includes down-converting a received signal to a non-zero intermediate frequency, converting, by an ADC, the down-converted received signal to I/Q data in a digital domain, down-converting the I/Q data to baseband for a signal of interest, down-converting the I/Q data to baseband for a mirror image of the signal of interest, generating correction coefficients based on the baseband I/Q data of the signal of interest and reference data, and modifying the baseband I/Q data of the signal of interest in a frequency domain using the correction coefficients to generate corrected I/Q data. The corrected I/Q data is generated based on the baseband I/Q data of the signal of interest and a complex conjugate of the baseband I/Q data of the mirror image of the signal of interest in a frequency domain.

Example 11 is the method of example 10, wherein the ADC is an RF ADC configured to digitize the down-converted received signal over a frequency of the signal of interest and a frequency of the mirror image of the signal of interest.

Example 12 is the method as in any one of examples 10-11, wherein the received signal is an OFDM modulated signal and a cyclic prefix attached to an OFDM symbol is longer than an impulse response length of an I/Q imbalance channel.

Example 13 is the method as in any one of examples 10-12, further comprising performing RF equalization.

Example 14 is the method as in any one of examples 10-13, wherein the reference data is obtained from a pilot signal, a reference symbol, or a training sequence included in the received signal.

Example 15 is a method for I/Q imbalance correction in a transceiver. The method includes generating correction coefficients for I/Q imbalance correction based on I/Q data and reference data, modifying the I/Q data for transmission using the correction coefficients to generate corrected I/Q data, wherein the corrected I/Q data is generated based on the I/Q data and a complex conjugate of the I/Q data at a mirror image frequency, converting the corrected I/Q data to an analog transmit signal, up-converting the analog transmit signal using a first local oscillator signal, receiving the up-converted analog transmit signal as a feedback signal, and generating the reference data based on the feedback signal. The feedback signal is down-converted using a second local oscillator signal to a zero intermediate frequency, and the reference data is generated by down-converting the feedback signal using the second local oscillator signal with different phase shifts at different time instants.

Example 16 is the method of example 15, wherein the phase shifts are any combination of two out of 0°, 45°, 60°, or 90°.

Example 17 is the method as in any one of examples 15-16, wherein the I/Q data is an OFDM modulated data and a cyclic prefix attached to an OFDM symbol is longer than an impulse response length of an I/Q imbalance channel.

Example 18 is the method as in any one of examples 15-17, further comprising performing RF equalization.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for in-phase/quadrature (I/Q) imbalance correction in a transceiver, comprising:
    an analog mixer circuit configured to down-convert a received signal to a non-zero intermediate frequency;
    an analog-to-digital converter (ADC) configured convert the down-converted received signal to I/Q data in a digital domain;
    a first down-conversion circuit configured to down-convert the I/Q data to baseband for a signal of interest;
    a second down-conversion circuit configured to down-convert the I/Q data to baseband for a mirror image of the signal of interest;
    an I/Q imbalance correction circuit configured to modify the baseband I/Q data of the signal of interest in a frequency domain using correction coefficients to generate corrected I/Q data, wherein the I/Q imbalance correction circuit is configured to generate the corrected I/Q data based on the baseband I/Q data of the signal of interest and a complex conjugate of the baseband I/Q data of the mirror image of the signal of interest in a frequency domain; and
    a correction coefficient generation circuit configured to generate the correction coefficients for the I/Q imbalance correction circuit based on the baseband I/Q data of the signal of interest and reference data.

2. The apparatus of claim 1, wherein the ADC is a radio frequency (RF) ADC configured to digitize the down-converted received signal over a frequency of the signal of interest and a frequency of the mirror image of the signal of interest.

3. The apparatus of claim 1, wherein the received signal is an orthogonal frequency division multiplex (OFDM) modulated signal and a cyclic prefix attached to an OFDM symbol is longer than an impulse response length of an I/Q imbalance channel.

4. The apparatus of claim 1, wherein the I/Q imbalance correction circuit is further configured to perform RF equalization.

5. The apparatus of claim 1, wherein the reference data is obtained from a pilot signal, a reference symbol, or a training sequence included in the received signal.

6. A method for in-phase/quadrature (I/Q) imbalance correction in a transceiver, comprising:
    down-converting a received signal to a non-zero intermediate frequency;

converting, by an analog-to-digital converter (ADC), the down-converted received signal to I/Q data in a digital domain;

down-converting the I/Q data to baseband for a signal of interest;

down-converting the I/Q data to baseband for a mirror image of the signal of interest;

generating correction coefficients based on the baseband I/Q data of the signal of interest and reference data; and modifying the baseband I/Q data of the signal of interest in a frequency domain using the correction coefficients to generate corrected I/Q data, wherein the corrected I/Q data is generated based on the baseband I/Q data of the signal of interest and a complex conjugate of the baseband I/Q data of the mirror image of the signal of interest in a frequency domain.

7. The method of claim 6, wherein the ADC is a radio frequency (RF) ADC configured to digitize the down-converted received signal over a frequency of the signal of interest and a frequency of the mirror image of the signal of interest.

8. The method of claim 6, wherein the received signal is an orthogonal frequency division multiplex (OFDM) modulated signal and a cyclic prefix attached to an OFDM symbol is longer than an impulse response length of an I/Q imbalance channel.

9. The method of claim 6, further comprising performing RF equalization.

10. The method of claim 6, wherein the reference data is obtained from a pilot signal, a reference symbol, or a training sequence included in the received signal.

* * * * *